(12) United States Patent
Tsujimoto

(10) Patent No.: US 10,557,874 B2
(45) Date of Patent: Feb. 11, 2020

(54) ELECTRIC CURRENT MEASUREMENT APPARATUS AND ELECTRIC CURRENT MEASUREMENT METHOD

(71) Applicant: OSAKA CITY UNIVERSITY, Osaka (JP)

(72) Inventor: Hiroaki Tsujimoto, Osaka (JP)

(73) Assignee: OSAKA CITY UNIVERISTY, Osaka-Shi (JP)

( * ) Notice: Subject to any disclaimer, the term of this patent is extended or adjusted under 35 U.S.C. 154(b) by 223 days.

(21) Appl. No.: 15/029,318

(22) PCT Filed: Sep. 10, 2014

(86) PCT No.: PCT/JP2014/004648
§ 371 (c)(1),
(2) Date: Apr. 14, 2016

(87) PCT Pub. No.: WO2015/056397
PCT Pub. Date: Apr. 23, 2015

(65) Prior Publication Data
US 2016/0223595 A1     Aug. 4, 2016

(30) Foreign Application Priority Data

Oct. 17, 2013 (JP) ................................. 2013-216852

(51) Int. Cl.
*G01R 15/20* (2006.01)
*G01R 19/00* (2006.01)
*G01R 21/08* (2006.01)

(52) U.S. Cl.
CPC .......... *G01R 15/205* (2013.01); *G01R 15/207* (2013.01); *G01R 19/0092* (2013.01); *G01R 21/08* (2013.01)

(58) Field of Classification Search
None
See application file for complete search history.

(56) References Cited

U.S. PATENT DOCUMENTS 4,464,625 A * 8/1984 Lienhard ................ G01R 33/09
                                                           323/294
5,172,052 A * 12/1992 Wells .................... G01R 15/202
                                                           324/117 H
(Continued)

FOREIGN PATENT DOCUMENTS

| CN | 101228453 | 7/2008 |
| CN | 101949965 | 1/2011 |

(Continued)

OTHER PUBLICATIONS

International Search Report, Patent Cooperation Treaty, dated Dec. 8, 2014, PCT Application No. PCT/JP2014/004648.
(Continued)

*Primary Examiner* — Nasima Monsur
(74) *Attorney, Agent, or Firm* — Lex IP Meister, PLLC

(57) ABSTRACT

An electric current measurement apparatus for measuring an electric current flowing in a conducting wire in a circuit to be measured, the electric current measurement apparatus characterized by having a magnetic element to which a drive electric current terminal and a measurement voltage terminal are provided, a holder for fixing a positional relationship of the conducting wire to a magnetic body, an electric current source capable of outputting at least one frequency of alternating electric current across the drive electric current terminal, a voltage meter for measuring a voltage across the measurement voltage terminal, and a low-pass filter provided between the measurement voltage terminal and the voltage meter.

15 Claims, 15 Drawing Sheets

(56) References Cited

U.S. PATENT DOCUMENTS

| | | | |
|---|---|---|---|
| 6,114,846 A * | 9/2000 | Bosselmann | G01R 33/0322 324/244.1 |
| 6,259,249 B1 * | 7/2001 | Miyata | G01B 7/003 324/207.12 |
| 6,433,545 B1 | 8/2002 | Kunze | |
| 7,294,995 B1 | 11/2007 | Stevens | |
| 2002/0047701 A1 | 4/2002 | Kawase | |
| 2007/0257657 A1 | 11/2007 | Stevens et al. | |
| 2009/0051344 A1 * | 2/2009 | Lumsden | H02M 5/2576 323/349 |
| 2009/0102465 A1 * | 4/2009 | Jansen | B82Y 25/00 324/207.21 |
| 2009/0206831 A1 | 8/2009 | Fermon | |
| 2009/0230955 A1 | 9/2009 | Kejik et al. | |
| 2011/0006753 A1 * | 1/2011 | Yu | G01R 15/185 324/117 R |
| 2012/0006224 A1 | 1/2012 | Oyanagi et al. | |
| 2012/0062224 A1 | 3/2012 | Ide et al. | |
| 2014/0049253 A1 | 2/2014 | Tsujimoto | |
| 2014/0239946 A1 * | 8/2014 | Suzuki | G01R 15/183 324/244 |

FOREIGN PATENT DOCUMENTS

| | | |
|---|---|---|
| DE | 36 42 478 | 6/1988 |
| DE | 3642478 | 12/1988 |
| EP | 1199573 | 4/2002 |
| GB | 2 438 057 | 11/2007 |
| GB | 2438057 | 11/2007 |
| JP | 07104011 | 4/1995 |
| JP | 2000055998 | 2/2000 |
| JP | 2001305163 | 10/2001 |
| JP | 2002131342 | 5/2002 |
| JP | 2002521696 | 7/2002 |
| JP | 2007322125 | 12/2007 |
| JP | 2009527745 | 7/2009 |
| JP | 2013156029 | 8/2013 |
| JP | 2013200253 | 10/2013 |
| WO | 2007095971 | 8/2007 |
| WO | 2012105459 | 8/2012 |

OTHER PUBLICATIONS

Supplementary European Search Report, European Patent Office, Application No. EP 14853530, dated Oct. 28, 2016.

SIPO, Office Action, Application No. of 201480057307.3, dated Mar. 2, 2018.

JPO, Office Action, Application No. of 2017-141591, dated May 8, 2018.

JPO, Office Action, Application No. of 2017-141590, dated May 8, 2018.

* cited by examiner

ELECTRIC CURRENT MEASUREMENT APPARATUS AND ELECTRIC CURRENT MEASUREMENT METHOD

TECHNICAL FIELD

The present invention relates to an electric current measurement apparatus and an electric current measurement method that can measure a spectrum of a current flowing in a measurement target circuit.

BACKGROUND ART

Recently, use of natural energy such as solar power generation and wind power generation, development of new energy such as fuel cells, and energy saving of various things including vehicles and home appliances are actively progressed due to an environmental problem. Reduction of energy consumption and reduction of power consumption are important problems of Japan and the whole world in the future.

It is said that one of solutions thereof is measurement and display of power consumption of an electric apparatus and an electronic apparatus, and management control of storage and consumption of power. To realize this, a measurement apparatus having small size and light weight and a low cost is necessary.

For example, a large amount of harmonic current is generated in an inverter to convert direct-current power generated by an inverter power supply or a solar battery incorporated in an air conditioner, an electric vehicle (EV), and a hybrid electric vehicle (HEV) into alternating-current power of a commercial frequency.

In measurement of the harmonic current, the current is converted into a voltage by an ammeter (also referred to as "CT": Current Transformer) and a shunt resistor, and the measurement using analysis (Fourier analysis) by a computer or a filter function by an electronic circuit is then performed.

In measurement of a high frequency/harmonic current, measurement precision greatly depends on a frequency characteristic (magnetic characteristic) of the CT used for the measurement, and there is a large problem in the measurement precision and reliability in a high frequency region. At the same time, the CT having a superior high frequency characteristic is generally expensive. At the same time, in the current measurement by the CT, a size of (a casing of) the CT becomes a problem. As a result, these factors obstruct size reduction and cost reduction of the device.

In addition, in a measurement method using the shunt resistor, enormous energy lost as a heat when a large current flows becomes a problem and insulation measures are necessary in many cases. Similar to the case of the CT, these factors obstruct the size reduction and the cost reduction of the device.

Meanwhile, in the related art, an electric current measurement apparatus using a magnetic element is known as an electric current measurement apparatus that does not use the shunt resistor and is relatively cheap. In the present specification and claims, the "magnetic element" is an element that changes an electrical characteristic by a magnetic field from the outside of the element. Therefore, a Hall element using a semiconductor is also handled as the magnetic element.

The magnetic element detects a magnetic field generated by a current. Therefore, current measurement using the magnetic element becomes technology called magnetic field detection widely. A clamp-type ammeter is representatively used. This is inserted into a magnetic circuit in which a conductor to which a current flows is configured using a magnetic material and a magnetic field generated by the current is detected by the magnetic element (Patent Literature 1).

In addition, the invention in which power consumption in a measurement target circuit is measured by the magnetic element is reported (Patent Literature 2). In addition, a magnetic field measurement apparatus using a magnetic impedance effect is reported (Patent Literature 3). The magnetic impedance effect is an effect in which, when an alternating current is flown to the magnetic element and a flow of the current is unevenly distributed on only a surface of the magnetic element by a skin effect, impedance of the magnetic element changes at high sensitivity with respect to an external magnetic field.

CITATION LIST

Patent Literature

Patent Literature 1: JP 07-104011 A
Patent Literature 2: WO2012/105459
Patent Literature 3: JP 2007-322125 A

SUMMARY OF INVENTION

Technical Problem

The clamp-type ammeter is normally used for measurement of a direct-current magnetic field and can display only a maximum magnetic field or an effective value when a current flowing in a measurement target circuit is an alternating current. In addition, a power meter using the magnetic element needs to be incorporated into the measurement target circuit. That is, a current of the measurement target circuit is used. However, it is not easy to measure a current that already flows to a certain circuit.

The magnetic field measurement apparatus using the magnetic impedance effect has high sensitivity, but measurement of the alternating current flowing in the measurement target circuit is not reported.

In addition, when a plurality of frequencies are overlapped in the measurement target circuit or frequencies of flowing currents are not known, these measurement apparatuses cannot measure the frequencies and the flowing currents.

However, as described above, to measure power consumption of the electric apparatus or the electronic apparatus or manage storage or consumption of the power, it is necessary to detect a frequency component and an amount of each current flowing in a conducting wire to which currents of numerous frequencies overlapped flow. When the inverter is used in particular, a frequency change and a current value for each frequency need to be detected.

Solution to Problem

The present invention has been made in view of the above problem. More specifically, according to the present invention, an electric current measurement apparatus for measuring a current flowing in a conducting wire of a measurement target circuit, includes:

a magnetic element which is provided with drive current terminals and measurement voltage terminals;

a holder which fixes a position relation of the magnetic element and the conducting wire;

a current generator which outputs an alternating current of at least one frequency between the drive current terminals;

a voltage meter which measures a voltage between the measurement voltage terminals; and a low-pass filter which is provided between the measurement voltage terminals and the voltage meter.

According to the present invention, an electric current measurement method includes:

a step of flowing an alternating current to a magnetic element disposed in the vicinity of a conducting wire to which a current of a measurement target circuit flows;

a step of observing an inter-terminal voltage of the magnetic element through a low-pass filter;

a step of changing a frequency of the alternating current; and a step of recording the inter-terminal voltage observed through the low-pass filter and the frequency of the alternating current.

Advantageous Effects of Invention

An electric current measurement apparatus according to the present invention can acquire a spectrum of a current flowing in a measurement target circuit with a simple configuration such as a magnetic element, a drive current generator, and a voltage meter. In addition, the measurement principle approximates to heterodyne and super heterodyne. However, an exclusively used circuit to perform the heterodyne is not necessary. In other words, the magnetic element may execute an operation.

In addition, measurement can be performed with precision of a band of a cutoff frequency of a low-pass filter. For example, the measurement can be performed with precision of a band of several Hz, with respect to a frequency of MHz order. That is, when a high frequency current is measured, a current of a conducting wire of the measurement target circuit can be detected with a very high Q value.

DESCRIPTION OF EMBODIMENTS

Hereinafter, an electric current measurement apparatus according to the present invention will be described with reference to the drawings. The following description exemplifies an embodiment of the present invention and the present invention is not limited thereto. The following embodiment can be changed without departing from the gist of the present invention.

First Embodiment

Figure 1:
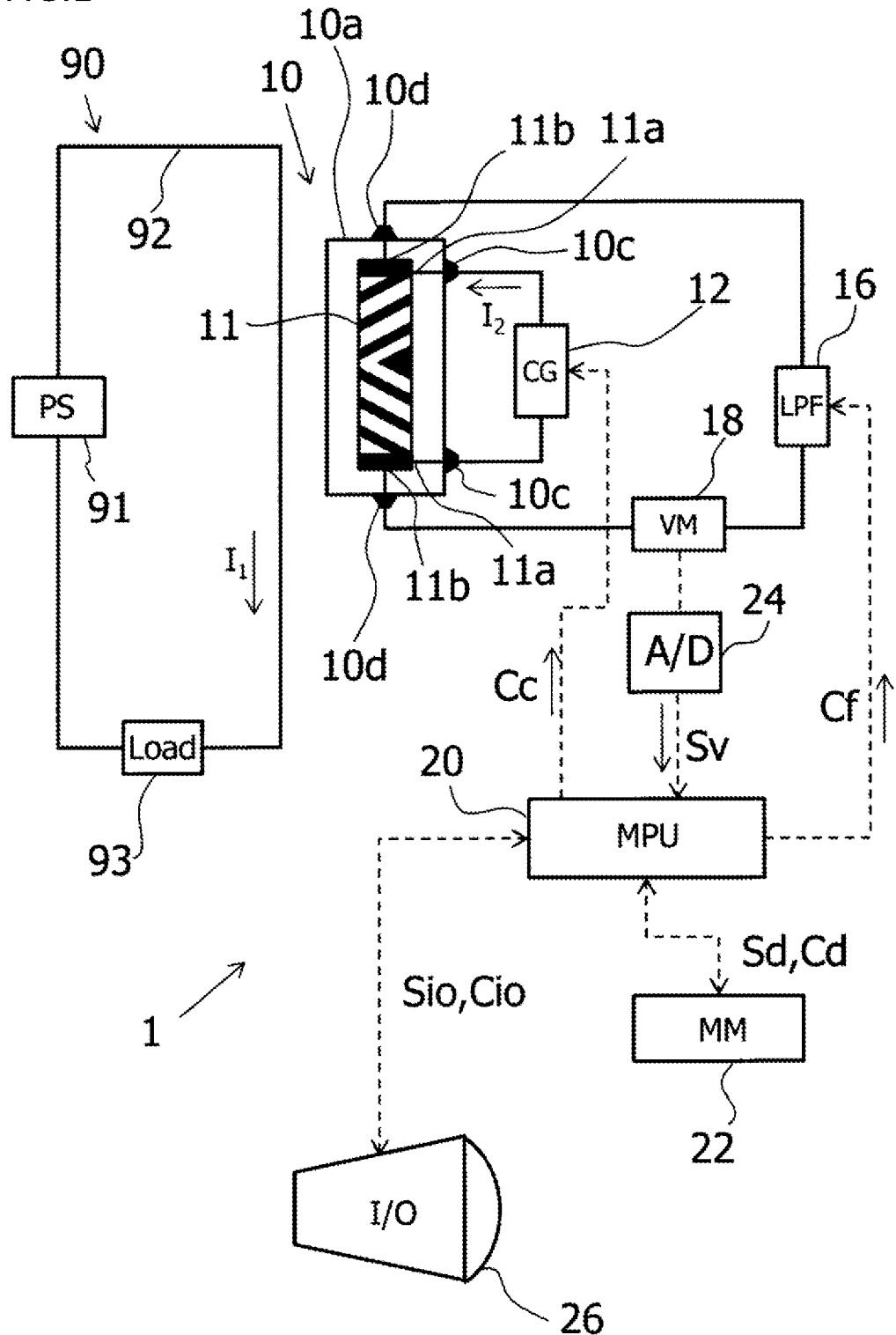
FIG. 1 is a diagram illustrating a configuration of an electric current measurement apparatus according to the present invention.

FIG. 1 illustrates a configuration of an electric current measurement apparatus 1 according to this embodiment. A measurement target circuit 90 includes a power supply (referred to as "PS") 91, a load 93, and a conducting wire 92 to connect the power supply 91 and the load 93. The electric current measurement apparatus 1 includes a sensor unit 10, a current generator (referred to as "CG") 12, a low-pass filter (referred to as "LPF") 16, and a voltage meter (referred to as "VM") 18.

A controller (Micro Processor Unit, described as "MPU") 20 to execute whole control, a memory (referred to as "MM") 22, an A/D converter (referred to as "A/D") 24, and an input/output device (referred to as "I/O") 26 may be further provided. A magnetic element 11 is disposed in the sensor unit 10. The magnetic element 11 may be a magnetoresistive element or a Hall element. In this embodiment, the case in which the magnetic element 11 is the magnetoresistive element is described.

In the sensor unit 10, the magnetic element 11 is fixed to an inside of a casing 10a. In addition, a holder 10b (although not illustrated in FIG. 1, it is described in detail with reference to FIG. 2) to fix apart (conducting wire 92) of the measurement target circuit 90 is disposed. In the electric current measurement apparatus 1 according to the present invention, because the conducting wire 92 in which a current flows is not clamped in a magnetic circuit, it is necessary to fix a distance between the magnetic element 11 and the conducting wire 92 (current).

Figure 2:
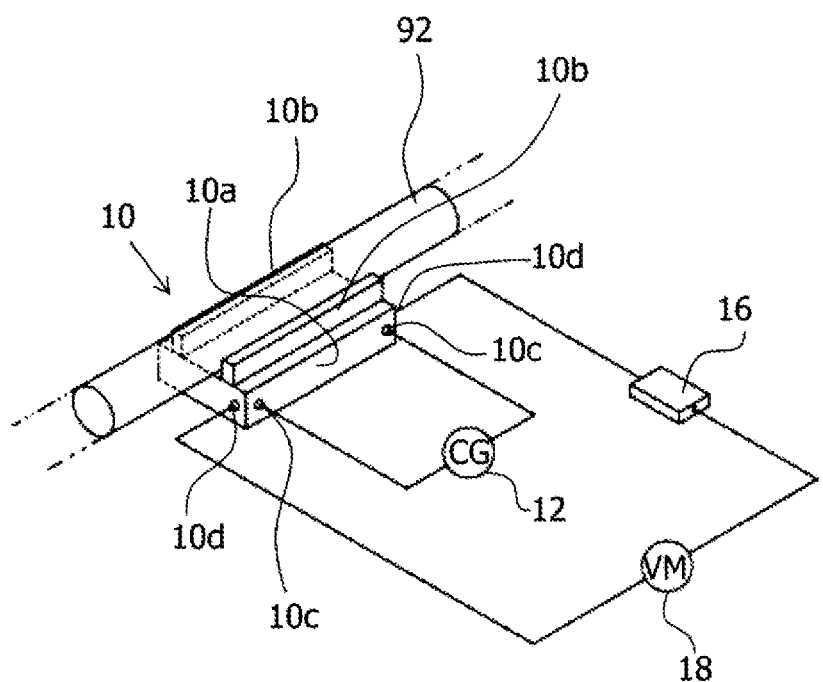
FIG. 2 is a partially enlarged view of a sensor unit.

FIG. 2 illustrates an example of the sensor unit 10. The sensor unit 10 includes the casing 10a formed of a nonmagnetic material to hold the magnetic element 11 (not illustrated in FIG. 2) inside and the holder 10b provided on a top surface thereof. In addition, current terminals 10c to connect the internal magnetic element 11 and the current generator 12 and voltage terminals 10d to measure a voltage of the magnetic element 11 are provided in the casing 10a.

The holder 10b can fix a distance between the magnetic element 11 and the conducting wire 92. If the holder 10b is formed of a nonmagnetic material, a shape is not limited in particular. The shape of the holder 10b may be changed according to a thickness of the conducting wire 92 or a thickness of coating of the conducting wire 92. The sensor unit may be replaced with the sensor unit 10 having the holder 10b with a different shape for each thickness of the conducting wire 92.

When the magnetic element 11 is the magnetoresistive element, the conducting wire 92 is preferably fixed to a portion on or a portion below the magnetic element 11 in a thickness direction thereof. This is because a magnetoresistive effect appears to an external magnetic field of an in-plane direction with respect to a current flowing in the magnetic element 11.

Meanwhile, when the Hall element is used for the magnetic element 11, the holder 10b is preferably fixed to a position that is parallel to the current flowing in the magnetic element 11 and is adjacent to the magnetic element 11. This is because a Hall effect appears to an external magnetic field from a direction vertical to the in-plane direction, with respect to the current flowing in the magnetic element 11. According to a difference of kinds of the magnetoresistive element and the hall element, an appropriate relation of a portion to detect a voltage of the magnetic element 11 and the conducting wire 92 may be different from the above description. The holder 10b may be formed to fix a position relation between the magnetic element 11 and the conducting wire 92.

Referring to FIG. 1 again, a pair of drive current terminals 11a for generating the current in the magnetic element 11 and a pair of measurement voltage terminals 11b for measuring the voltage of the magnetic element 11 are provided in the magnetic element 11. The drive current terminal 11a is connected to the current terminal 10c provided in the casing 10a of the sensor unit 10 and the measurement voltage terminal 11b is connected to the voltage terminal 10d of the casing 10a.

Because the magnetic element 11 used in the sensor unit 10 may be either the magnetoresistive element or the Hall element, the drive current terminal 11a and the measurement voltage terminal 11b may be commonly used or may be in a position relation of a right angle. When the magnetic element 11 is the magnetoresistive element, the drive current terminal 11a and the measurement voltage terminal 11b are often commonly used. In addition, when the magnetic element 11 is the Hall element, the drive current terminal 11a and the measurement voltage terminal 11b are often in the position relation of the right angle.

The current generator 12 (CG) is a current source to supply an alternating current. The current generator 12 is connected to the current terminal 10c of the sensor unit 10. Because the current terminal 10c of the sensor unit 10 and the drive current terminal 11a of the magnetic element 11 are connected to each other, it may be said that the current generator 12 is connected to the drive current terminal 11a.

In the current generator 12, a frequency is preferably variable. This is because the electric current measurement apparatus 1 measures a current of a frequency almost equal to a frequency generated by the current generator 12 among currents flowing in the conducting wire 92. A plurality of AC current generators 12 may be provided and may be sequentially switched. Such a configuration will be illustrated in a second embodiment. When a frequency to be measured is previously known, it is not excluded that the current generator 12 supplies a current of only the frequency.

In addition, the current generator 12 may be a constant voltage source as well as a constant current source. A frequency characteristic of the current flowing in the magnetic element 11 can be known by previously measuring the frequency characteristic. Therefore, measurement sensitivity depending on an amount of the current flowing in the magnetic element 11 can be corrected thereafter. Particularly, when the constant voltage source is used as the current generator 12, impedance of the magnetic element 11 is changed according to a frequency. For this reason, an amount of flowing current is different according to the frequency. Therefore, preferably, an amount of flowing current is previously measured for each frequency and a table or a correction value is prepared.

The voltage meter 18 is connected to the measurement voltage terminal 11b of the magnetic element 11 via the voltage terminal 10d provided in the casing 10a. Because the measurement voltage terminal 11b and the voltage terminal 10d are connected to each other, it may be said that the voltage meter 18 is connected to the measurement voltage terminal 11b. The voltage meter 18 may have an appropriate amplifier inside and a direct-current voltage may be measured. This is because the voltage meter 18 measures only a voltage between both ends of the magnetic element 11 through the low-pass filter 16.

In addition, the low-pass filter 16 (referred to as the LPF) is disposed between the magnetic element 11 and the voltage meter 18. A cutoff frequency fc of the low-pass filter 16 may be fixed. More preferably, an active filter has an attenuation rate changed by an external control signal. In addition, in the case of a configuration in which the cutoff frequency fc can be changed, because a measurement bandwidth at the time of measuring a current can be changed, this is preferable.

A one-chip computer is suitable for the controller 20. Of course, other configuration is not excluded. The controller 20 is connected to the current generator 12 and the voltage meter 18. When the cutoff frequency fc of the low-pass filter 16 is variable and can be controlled by the controller 20, the controller 20 may be connected to the low-pass filter 16. The controller 20 can transmit an instruction signal Cc to the current generator 12 to control timing for generating current and the magnitude and the frequency of the generated current. In addition, the cutoff frequency fc of the low-pass filter 16 can be changed by an instruction signal Cf. In addition, a measurement signal Sv from the voltage meter 18 can be received.

The input/output device 26 capable of operated by an operator and the memory 22 may be connected to the controller 20. This is because the controller performs start of measurement, progress of the measurement, display of measurement data, and storage of the measurement data. The controller 20 can exchange an output signal Cio and an input signal Sio with the input/output device 26. The measurement data is included in the output signal Cio and an instruction signal for the controller 20 is included in the input signal Sio. In addition, the A/D converter 24 may be disposed between the controller 20 and the voltage meter 18. This is because an output of the voltage meter 18 may be an analog signal.

Next, the magnetic element 11 will be described in detail. The magnetic element 11 has a property that a current flow is changed by a magnetic field applied from the outside. The change of the current flow may be observed by a voltage of a current direction and may be observed by a voltage of a direction perpendicular to the current direction, with respect to the element. A representative example of the former is the magnetoresistive effect and a representative example of the latter is the Hall effect.

Figure 3A:
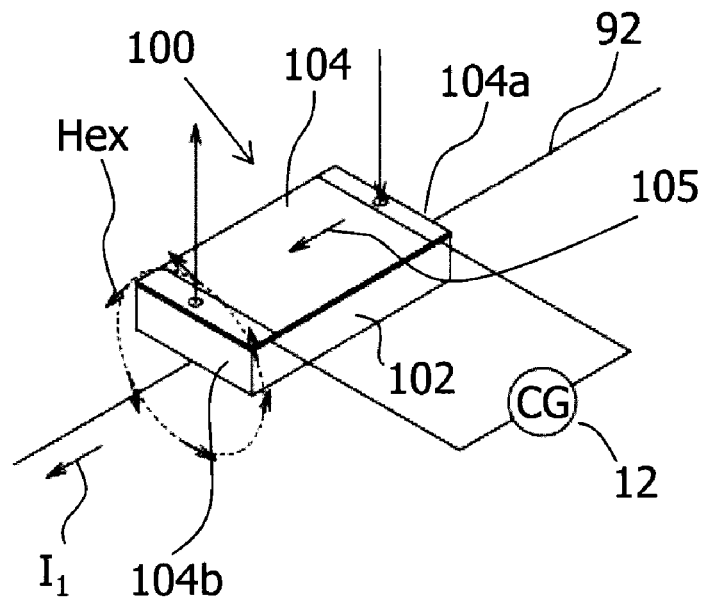
FIGS. 3A and 3B are diagrams illustrating the principle of a magnetoresistive element.
Figure 3B:
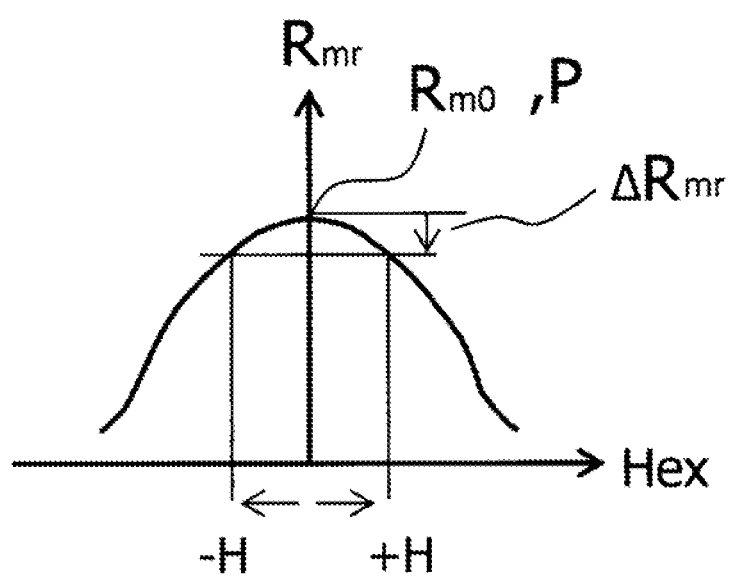

FIGS. 3A and 3B are graphs illustrating the magnetoresistive element and the magnetoresistive effect. In a magnetoresistive element 100, a magnetic film 104 is formed on a strip-shaped substrate 102. A direction from one end 104a of a strip shape to the other end 104b is called a longitudinal direction. The magnetic film 104 is preferably formed such that a magnetization easy axis is induced in the longitudinal direction.

In the magnetoresistive element 100, a current 105 flows in the longitudinal direction. In addition, the magnetoresistive element is disposed such that the longitudinal direction is matched with a direction in which a current $I_1$ of the conducting wire 92 of the measurement target circuit flows. In FIG. 3A, an aspect where the conducting wire 92 of the measurement target circuit is disposed below the substrate 102 is illustrated. When the current $I_1$ flows in the conducting wire 92, an external magnetic field Hex is generated in a surrounding portion thereof. The external magnetic field Hex inclines magnetization of the magnetic film 104 of the longitudinal direction from the magnetization easy axis. That is, the direction of the current 105 flowing in the magnetic film 104 and the direction of the magnetization change. At this time, the magnetoresistive effect is generated and electrical resistance of the magnetic film 104 changes.

FIG. 3B illustrates a graph illustrating a general magnetoresistive effect. A horizontal axis shows an external magnetic field Hex (A/m) applied from a direction perpendicular to the longitudinal direction of the magnetic film 104 and a vertical axis shows electrical resistance (hereinafter, simply referred to as a "resistance value") Rmr (Ω) of the longitudinal direction of the magnetic film 104. The electrical resistance of the magnetic film 104 when the external magnetic field Hex is not applied is set as Rm0. If the external magnetic field Hex is applied to the magnetoresistive element 100, the electrical resistance is decreased by ΔRmr.

In addition, the decrease in the electrical resistance Rmr does not depend on the direction (positive/negative direction) of the external magnetic field Hex. That is, the magnetoresistive effect has a characteristic of an even function with respect to the external magnetic field Hex. In addition, when the external magnetic field Hex is small, the electrical resistance Rmr changes in only the vicinity of a peak value (in the vicinity of Hex=0) of the even function. For this reason, the change ΔRmr of the electrical resistance is small and linearity is also low. That is, if an operation point P is at a point where the external magnetic field Hex is zero, this is not preferable for an element used for a sensor. The operation point P means a point when the external magnetic field Hex is zero on a curve showing the magnetoresistive effect and at this time, a value of the electrical resistance is Rm0.

Figure 4A:
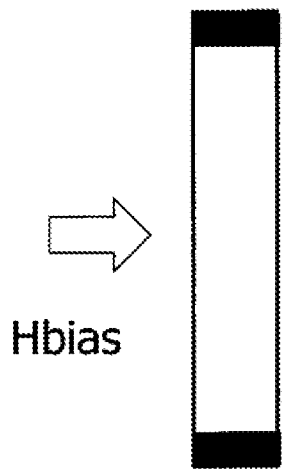
FIGS. 4A to 4C are diagrams illustrating a bias mechanism.
Figure 4B:
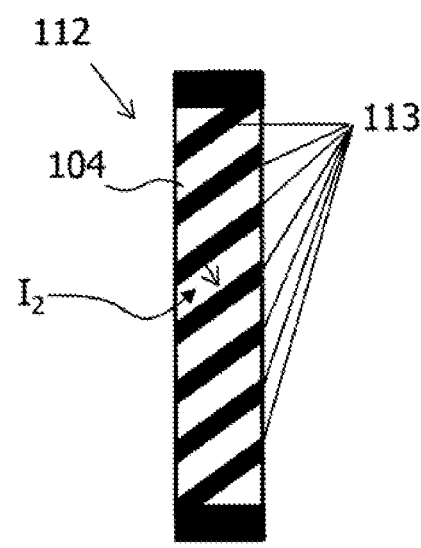
Figure 4C:
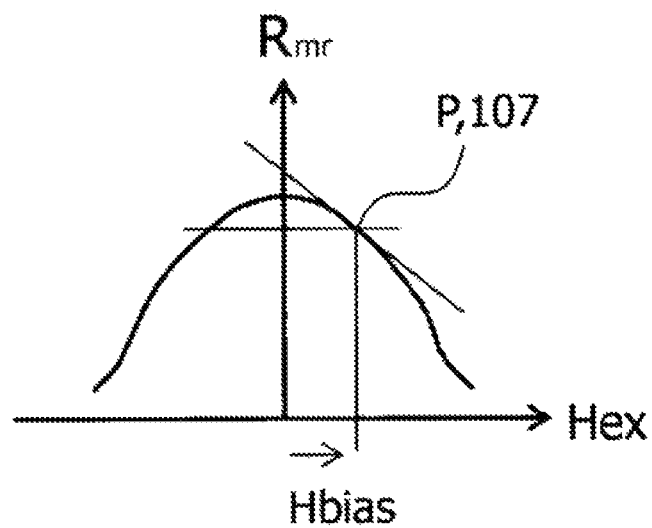

FIGS. 4A and 4B illustrate an improved magnetoresistive element. FIG. 4C illustrates a graph corresponding to FIG. 3B. FIG. 4C illustrates a state in which the operation point P is moved to a point shown by a reference numeral 107 by previously applying a bias magnetic field Hbias to the magnetoresistive element. As such, by setting the operation point P to an inclined portion of a characteristic curve showing the magnetoresistive effect, even though the external magnetic field Hex is small, the change in the electrical resistance Rmr increases and the direction of the external magnetic field Hex can be distinguished in the direction of the change of the resistance value. More specifically, as illustrated in FIG. 4A, the bias magnetic field Hbias may be applied from the direction perpendicular to the longitudinal direction of the strip-shaped magnetoresistive element.

FIG. 4B illustrates a magnetoresistive element 112. The magnetoresistive element 112 is obtained by forming an inclined continuous pattern 113 (pattern of a barber pole type) on a surface of the magnetic film 104 with a conductor such as copper. Because a current $I_2$ flowing between the continuous pattern 113 of the inclined conductor flows in a shortest distance of the inclined pattern, the current $I_2$ flows in an inclined direction when viewed from the longitudinal direction (direction where the magnetization easy axis is formed). Even though the bias magnetic field Hbias is not used, when the external magnetic field Hex is zero, the directions of the current and the magnetization are inclined in the magnetoresistive element 112. For this reason, the magnetoresistive element 112 has an effect that the bias magnetic field Hbias is applied. That is, as illustrated in FIG. 4C, the operation point P is set to the inclined portion of the characteristic curve.

In the present specification, bias mechanism means not only providing a magnet for bias, but also what has an effect having an apparent bias magnetic field Hbias due to a pattern configuration of the conductor as illustrated in FIG. 4B.

Figure 5A:
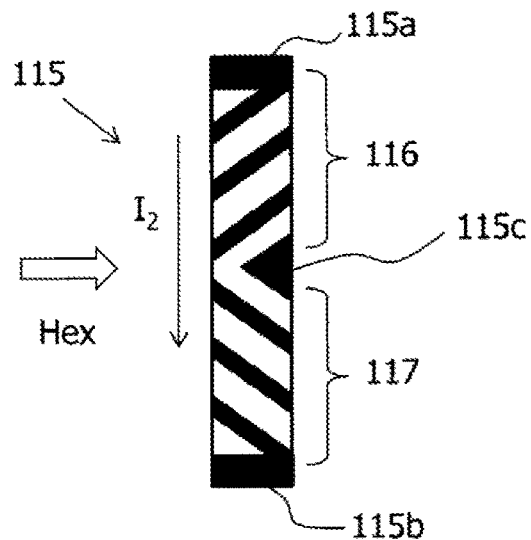
FIGS. 5A to 5C are diagrams illustrating the case in which two barber poles are formed to face each other.
Figure 5B:
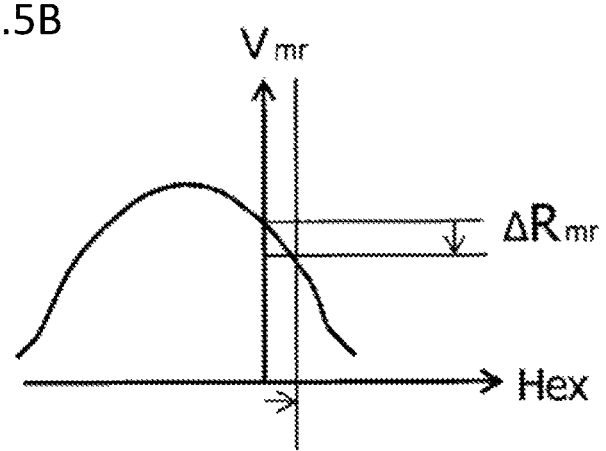
Figure 5C:
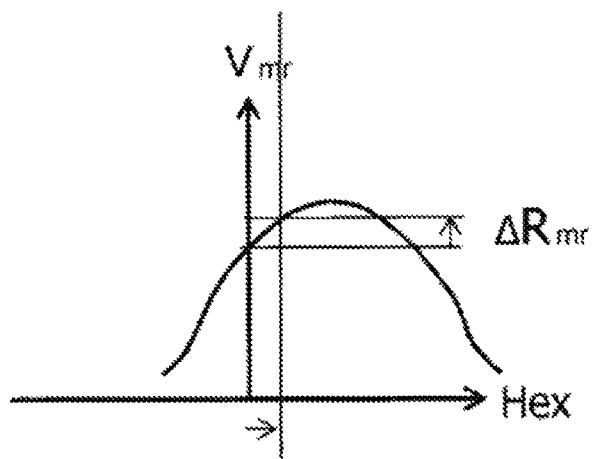

FIG. 5A illustrates a magnetoresistive element 115 in which two patterns of a barber pole type are disposed to face each other. In the drawing, an upper magnetoresistive element is represented by a reference numeral 116 and a lower magnetoresistive element is represented by a reference numeral 117. In addition, a graph showing a magnetoresistive effect of the magnetoresistive element 116 is illustrated in FIG. 5B and a graph showing a magnetoresistive effect of the magnetoresistive element 117 is illustrated in FIG. 5C.

In the magnetoresistive element 115, a center portion 115c is connected to a ground (center tap) and the current $I_2$ flows from one end 115a to the other end 115b. At this time, an inclined direction of the current $I_2$ depends on inclined patterns.

At this time, in the magnetoresistive element 116, electrical resistance between the terminal 115a and the center portion 115c is decreased by ΔRmr and in the magnetoresistive element 117, electrical resistance between the center portion 115c and the terminal 115b is increased by ΔRmr. Because the center portion 115c is connected to a ground, the electrical resistance in the magnetoresistive element 117 increases to a minus side.

Therefore, the electrical resistance decreases by 2ΔRmr between the terminals 115a and 115b. That is, an output of a double (+6 dB) of each element can be obtained in both ends of the magnetoresistive element 115. The magnetic element 11 of FIG. 1 exemplifies this type. That is, the magnetic element 11 has the center tap that is connected to a ground.

Figure 6A:
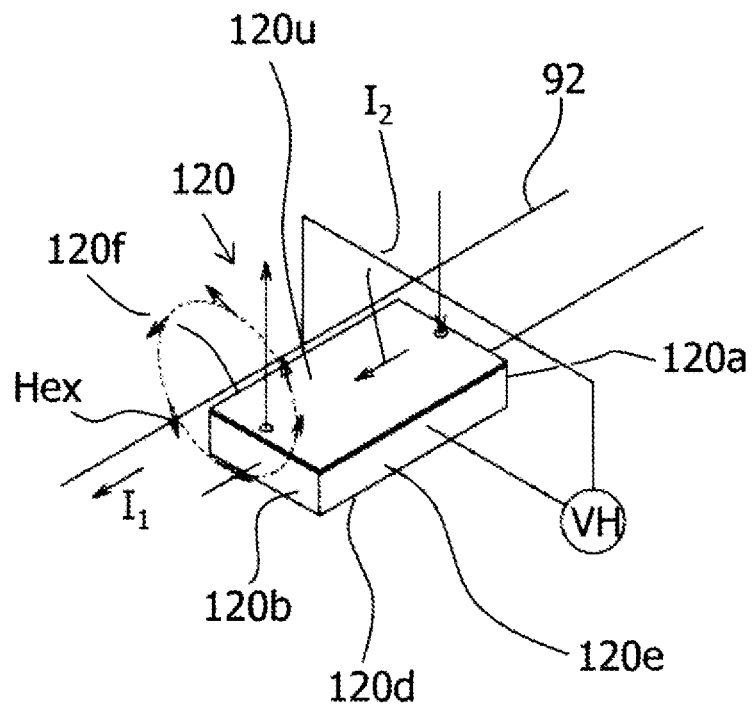
FIGS. 6A and 6B are diagrams illustrating the principle of a Hall element.
Figure 6B:
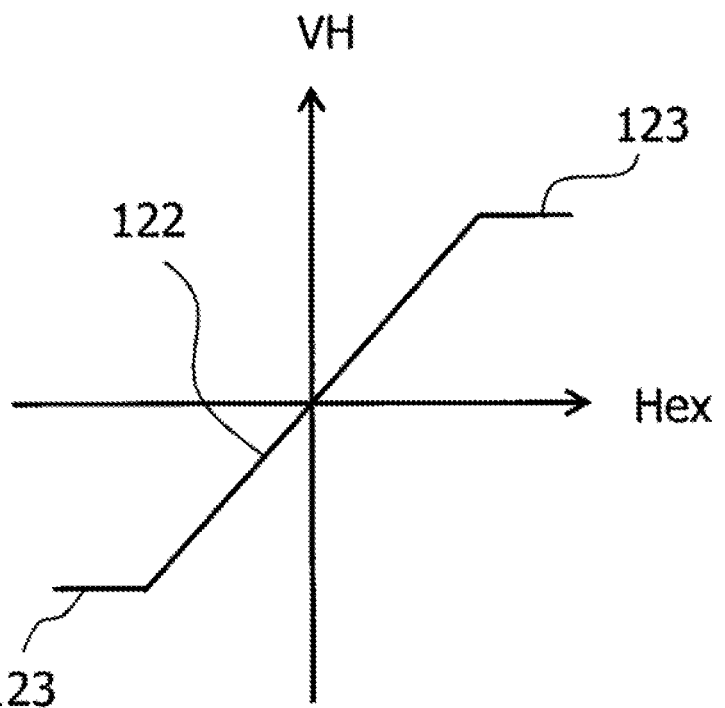

FIGS. 6A and 6B illustrate a Hall element 120 and a characteristic thereof. A Hall effect appears when a current flowing through the Hall element 120 is unevenly distributed in the element due to a magnetic field applied from a direction perpendicular to a flow of the current and a potential difference is generated.

The current $I_2$ flows from one end 120a to the other end 120b of the Hall element 120. Meanwhile, the conducting wire 92 of the measurement target circuit is disposed to be adjacent to the Hall element 120. The external magnetic field Hex generated by the current $I_1$ flowing in the conducting wire 92 passes from a bottom surface 120d to a top surface 120u of the Hall element 120. In this case, the flowing current $I_2$ receives force and is distributed in a width direction 120f of the Hall element 120. By the uneven distribution, a potential difference is generated in the width direction (120e and 120f) of the Hall element 120. The potential difference is called a Hall voltage VH.

FIG. 6B illustrates a graph showing a characteristic thereof. A horizontal axis shows the external magnetic field Hex. In addition, a vertical axis shows the Hall voltage VH. In the Hall element 120, when the external magnetic field Hex has the predetermined magnitude, a substantially linear portion 122 is observed. If the external magnetic field Hex is more than a predetermined value, a portion 123 in which the Hall voltage VH is saturated is observed. An embodiment using the Hall element 120 is illustrated in a second embodiment.

Next, the measurement principle of the electric current measurement apparatus 1 according to the present invention will be described with reference to FIG. 1 again. It is assumed that the current $I_1$ flows in the measurement target circuit 90 and the current $I_2$ flows in the magnetic element 11. A magnetic field H generated in the vicinity of the conducting wire 92 of the measurement target circuit 90 by the conducting wire 92 is represented by a formula (1). In the following description of formulae, the magnetic field H may be replaced with the external magnetic field Hex.

$$H = \alpha I_1 \quad (1)$$

Here, a is a proportional constant. When the magnetic element 11 is disposed in the vicinity of the conducting wire 92, the magnetic element 11 receives the magnetic field H generated by the conducting wire 92 and the resistance value Rmr is changed by the magnetoresistive effect. When a change in the resistance value is set as $\Delta Rmr$, $\Delta Rmr$ is represented by a formula (2).

$$\Delta Rmr = \beta H \quad (2)$$

Here, $\beta$ is also a proportional constant. If the formula (1) is substituted for the formula (2), a formula (3) is obtained.

$$\Delta Rmr = \alpha \beta I_1 \quad (3)$$

Because the current $I_2$ flows to the magnetic element 11, a change $\Delta Vmr$ of a voltage between the terminals of the magnetic element 11 is represented by a formula (4), by the formula (3).

$$\Delta Vmr = \Delta Rmr \times I_2 \quad (4)$$

Assuming that electrical resistance of the magnetic element 11 when the magnetic field H is not applied from the outside is set as Rm0, the both end voltage Vmr of the magnetic element 11 is represented by a formula (5).

$$Vmr = (Rm0 + \Delta Rmr) \times I_2 \quad (5)$$
$$= (Rm0 + \alpha \beta I_1) \times I_2$$

The current $I_1$ flowing in the measurement target circuit 90 and the current $I_2$ flowing in the magnetic element 11 are represented by formulae (6) and (7), respectively.

$$I_1 = I_1 \sin 2\pi f_1 t \quad (6)$$

$$I_2 = I_2 \sin 2\pi f_2 t \quad (7)$$

Here, $f_1$ and $f_2$ show frequencies and t shows a time. "$\pi$" shows a circular constant.

When the formulae (6) and (7) are substituted for the formula (5) and the formulae (1) to (3) are considered, the both end voltage Vmr of the magnetic element 11 is represented by a formula (8).

$$V_{mr} = (R_{m0} + \Delta R_{mr}) \times I_2 \quad (8)$$
$$= (R_{m0} + \alpha \beta I_1) \times I_2$$
$$= (R_{m0} + \alpha \beta I_1 \sin 2\pi f_1 t) \times I_2 \sin 2\pi f_2 t$$
$$= R_{m0} I_2 \sin 2\pi f_2 t + \alpha \beta \gamma I_1 I_2 [\cos 2\pi (f_1 - f_2)t - \cos 2\pi (f_1 + f_2)t]$$

As represented by the formula (8), a voltage Vmr having two frequency components ($f_1 - f_2$ and $f_1 + f_2$) of $\alpha \beta \gamma I_1 I_2 \cos 2\pi (f_1 - f_2)t$ and $\alpha \beta \gamma I_1 I_2 \cos 2\pi (f_1 + f_2)t$ is observed in both ends of the magnetic element 11. In addition, $\gamma$ is a proportional constant.

Here, by observing the both end voltage Vmr of the magnetic element 11 through the low-pass filter 16 having a cutoff frequency fc which is $|f_1 - f_2|$ (| | shows an absolute value) or less, the frequency component of $f_1 + f_2$ is not observed. At this time, a voltage Vs is represented by a formula (9).

$$Vs = \alpha \beta \gamma I_1 I_2 \cos 2\pi (f_1 - f_2)t \quad (9)$$

If the cutoff frequency fc is sufficiently decreased and a frequency $f_2$ of the current $I_2$ flowing in the magnetic element 11 is sequentially changed, a voltage Vs represented by a formula (10) is observed when the frequency $f_2$ is in the vicinity of the frequency $f_1$.

$$Vs = \alpha \beta \gamma I_1 I_2 \quad (10)$$

This is because $f_1 - f_2$ approaches zero and thus a term of cosine (cos) of the formula (9) is regarded as 1.

That is, the current $I_2$ of the frequency $f_2$ flowing in the conducting wire 92 can be observed as a current spectrum of a measurement bandwidth 2fc (when a complex filter is used, a bandwidth is fc). As such, applying the signal of the frequency $f_2$ to the signal of the frequency $f_1$ to obtain a signal of a frequency $f_1 - f_2$ lower than $f_1$ is called down conversion.

Figure 7A:
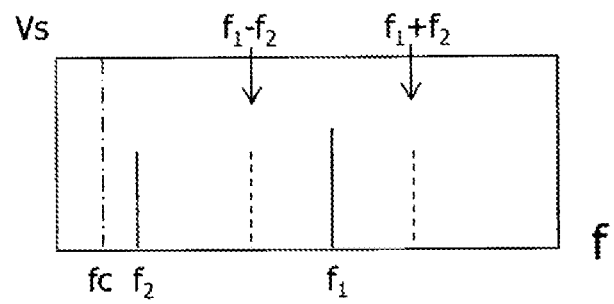
FIGS. 7A to 7D are diagrams illustrating the principle of current measurement according to the present invention.
Figure 7B:
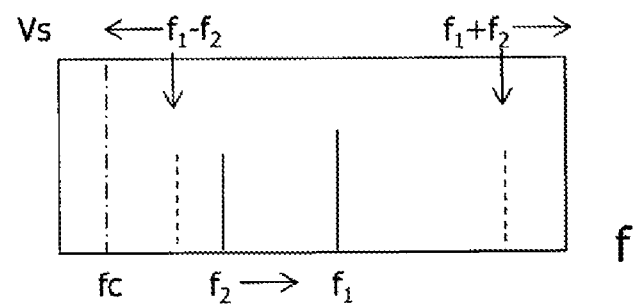
Figure 7C:
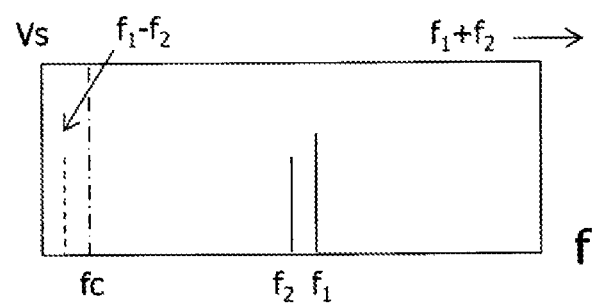

FIGS. 7A to 7D illustrate this relation. In FIGS. 7A to 7C, a horizontal axis shows a frequency f and a vertical axis shows an output Vs of the voltage meter 18. A frequency of the current $I_1$ flowing in the measurement target circuit 90 is set as $f_1$. Referring to FIG. 7A, the current $I_2$ of the frequency $f_2$ flows from the current generator 12 of the electric current measurement apparatus 1 and the current $I_1$ of the frequency $f_1$ flows in the conducting wire 92 of the measurement target circuit 90. In this case, in both ends of the magnetic element 11, signals of $f_1 - f_2$ and $f_1 + f_2$ are generated as represented by the formula (8).

Next, the frequency $f_2$ of the current generator 12 is increased. Referring to FIG. 7B, when the frequency $f_2$ approaches the frequency $f_1$ of the current $I_1$ flowing in the measurement target circuit 90, a value of $f_1 - f_2$ decreases and a frequency thereof approaches zero. In contrast, a frequency of $f_1 + f_2$ increases.

Referring to FIG. 7C, when the frequency $f_2$ of the current $I_2$ of the current generator 12 further approaches the frequency $f_1$ of the current $I_1$, $f_1 - f_2$ becomes a low frequency and becomes less than the cutoff frequency fc. A signal of the frequency $f_1 - f_2$ that becomes the cutoff frequency fc or less can be observed as the voltage Vs by the voltage meter 18, as represented by the formula (10). That is, by sequentially changing the frequency $f_2$ of the current $I_2$ flowing in the magnetic element 11 to measure the both end voltage of the magnetic element 11, the magnitude and the frequency $f_1$ of the current $I_1$ flowing in the conducting wire 92 can be detected.

Figure 7D:
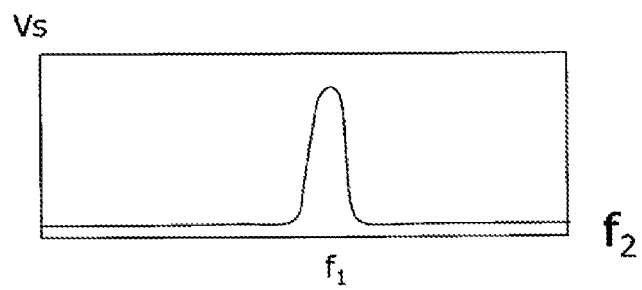

In FIG. 7D, a horizontal axis shows the frequency $f_2$ of the current generator 12 and a vertical axis shows the output Vs of the voltage meter 18. At the side of the electric current measurement apparatus 1, the frequency $f_2$ of the current $I_2$ flowing in the magnetic element 11 is already known and a value of the both end voltage of the magnetic element 11 through the low-pass filter 16 can be known by the output Vs from the voltage meter 18. Therefore, values of the horizontal and vertical axes of FIG. 7D are data that can be obtained at the side of the electric current measurement apparatus 1. FIG. 7D can be displayed on the input/output device 26 by the controller 20.

As such, by setting the horizontal axis to be the frequency $f_2$ of the current generator 12 and the vertical axis to be the direct-current component (Vs) of the both end voltage of the magnetic element 11, the current $I_1$ flowing in the conducting wire 92 of the measurement target circuit 90 can be measured. The vertical axis is corrected with an appropriate correction value, so that the vertical axis can be converted into strength of the current $I_1$. As described above, in the electric current measurement apparatus 1 according to the present invention, a current spectrum of the measurement target circuit 90 can be obtained without using a complex circuit such as heterodyne and super heterodyne.

This relation is realized as well even when frequencies $f_1$ of the current $I_1$ flowing in the measurement target circuit 90 are plural. For example, the current $I_1$ flowing in the measurement target circuit 90 represented by the formula (6) is represented by a formula (11).

$$I_1 = \sum_{n=1}^{\infty} I_n \sin 2\pi f_{1,n} t \tag{11}$$

Here, n shows a natural number and $f_{1,n}$ shows a frequency of an n-th current flowing in the conducting wire 92. At this time, amplitude of the current is $I_n$. If the current $I_2$ flowing in the magnetic element 11 is set as the same as the formula (7) and the formulae (11) and (7) are substituted for the formula (5), a terminal voltage Vmr of the magnetic element 11 is represented by a formula (12).

$$\begin{aligned}
V_{mr} &= R_{mr} I_2 \tag{12}\\
&= (R_{m0} + \Delta R_{mr}) \cdot I_2 \\
&= \left\{ R_{m0} + \alpha\beta \sum_{n=1}^{\infty} I_n \sin 2\pi f_{1,n} t \right\} \times I_2 \sin 2\pi f_2 t \\
&= R_0 I_2 \sin 2\pi f_2 t + \alpha\beta\gamma \left\{ \sum_{k=1}^{\infty} I_n I_2 [\cos 2\pi (f_{1,n} - f_2) t - \cos 2\pi (f_{1,n} + f_2) t] \right\}
\end{aligned}$$

By setting the cutoff frequency fc lower than $|f_{1,n} - f_2|$, Vmr is represented by a formula (13).

$$V_{mr} = \alpha\beta\gamma \left\{ \sum_{k=1}^{\infty} I_n I_2 [\cos 2\pi (f_{1,n} - f_2) t] \right\} \tag{13}$$

Similar to the case in which the current $I_1$ of the measurement target circuit 90 has only the frequency $f_1$, by sequentially changing the frequency $f_2$ of the current $I_2$ flowing in the magnetic element 11, a voltage Vs observed when $f_2$ is in the vicinity of $f_{1,n}$ is represented by a formula (14).

$$Vs = \alpha\beta\gamma I_n I_2 \tag{14}$$

In addition, a bandwidth when the voltage is measured is 2fc. The above description is realized equally even when the magnetic element 11 is the Hall element.

Assuming the above description, an operation of the electric current measurement apparatus 1 will be described with reference to FIG. 1 again. The current generator 12 flows a current from a minimum frequency $f_{2,0}$ to a maximum frequency $f_{2,n}$. For simplification, it is assumed that current having two kinds of frequencies flows in the measurement target circuit 90. These frequencies are set as $f_{1,1}$ and $f_{1,2}$. In this case, $f_{1,1} < f_{1,2}$ is satisfied. The conducting wire 92 of the measurement target circuit 90 is fixed to the holder 10b (refer to FIG. 2) of the sensor unit 10. In addition, it is assumed that a correction value for the magnetic element 11 is already acquired.

The correction value includes a value capable of converting the both end voltage of the magnetic element 11 to become the same frequency and the same value as the current flowing in the conducting wire 92. In addition, the correction value may be previously determined and may be recorded in the memory 22.

Figure 8:
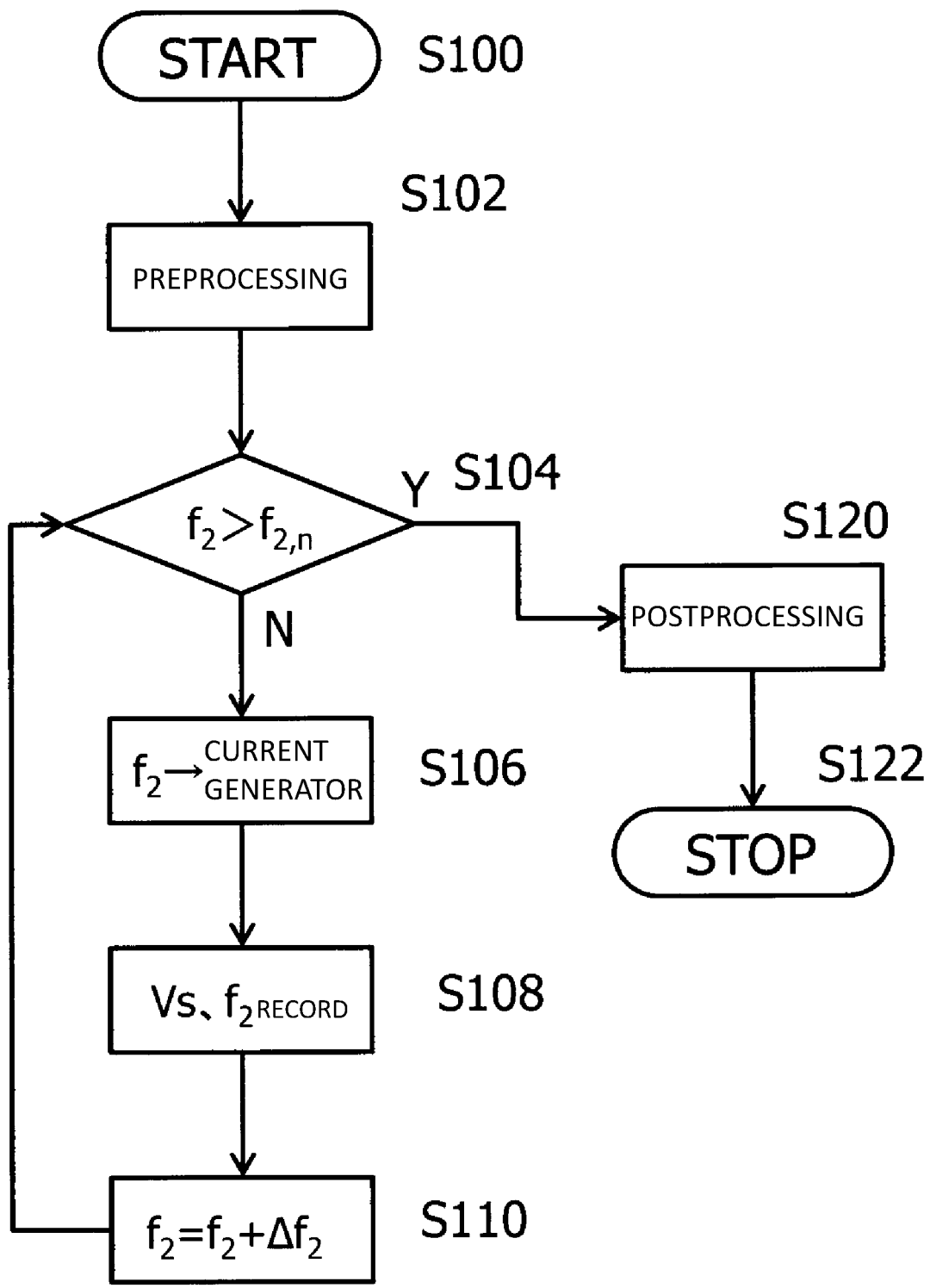
FIG. 8 is a diagram illustrating a process flow of the electric current measurement apparatus.

The following process flow is executed by the controller 20, but may be executed manually. FIG. 8 illustrates an example of a flow of the controller 20. An operator transmits start of measurement to the controller 20 by an output signal Cio from the input/output device 26. When the measurement starts (step S100), the controller 20 executes preprocessing (step S102). The preprocessing includes a process for setting the frequency $f_2$ of the current generator 12 to the minimum frequency $f_{2,0}$. In addition, it is determined whether the frequency $f_2$ is higher than the maximum frequency $f_{2,n}$ (step S104). If the frequency $f_2$ is higher than the maximum frequency $f_{2,n}$ (Y of step S104), postprocessing (step S120) is executed and the measurement ends (step S122).

Here, the maximum frequency $f_{2,n}$ means a maximum value of a frequency that can be supplied by the current generator 12 and the minimum frequency $f_{2,1}$ means a minimum value of a frequency that can be supplied by the current generator 12. If the current generator 12 can supply an alternating current, a zero frequency (that is, a direct current) may be included in the minimum frequency. A constant current generated in the magnetic element 11 can detect a constant current overlapped in the measurement target circuit 90.

If the frequency $f_2$ is not higher than the maximum frequency $f_{2,n}$ (N of step S104), a value of $f_2$ is transmitted to the current generator 12 to make it output a current of the frequency $f_2$ (step S106). In addition, the both end voltage (Vs) of the magnetic element 11 through the low-pass filter 16 is measured by the voltage meter 18. Next, the output Vs of the voltage meter 18 and the value of $f_2$ are recorded in the memory 22 (step S108). Next, the frequency $f_2$ of the current generator 12 is changed by a predetermined frequency $\Delta f_2$ (step S110).

In addition, the process returns to step S104. The controller 20 records the output Vs of the voltage meter 18 and $f_2$ at that time while increasing the frequency $f_2$ of the current generator 12, until new $f_2$ becomes higher than the maximum frequency $f_{2,n}$.

If the frequency $f_2$ of the current generator 12 becomes a value in the vicinity of $f_{1,1}$, the output Vs through the low-pass filter 16 represented by the formula (14) is obtained from the voltage meter 18. In addition, if a difference of $f_2$ with $f_{1,1}$ increases, the both end voltage (Vs) of the magnetic element 11 observed through the low-pass filter 16 decreases. In addition, if $f_2$ becomes a value in the vicinity of $f_{1,2}$, the both end voltage (Vs) of the magnetic element 11 measured through the low-pass filter 16 again increases.

If, as a result of increasing $f_2$ by $\Delta f_2$ in step S110, $f_2$ becomes higher than the maximum frequency $f_{2,n}$, the measurement ends and a flow of the process changes to Y of step S104. If the process proceeds to step S120, the controller 20 executes the postprocessing (step S120) and the process stops (step S122).

Here, the postprocessing (step S120) may be a process for outputting the frequency $f_2$ and the output result Vs of the voltage meter 18 recorded in the memory 22 to the input/output device 26. Particularly, when a constant voltage oscillator of variable frequencies is used as the current generator 12, the current $I_1$ flowing in the magnetic element 11 is changed by the frequency $f_2$. Therefore, a correction value is prepared for each frequency and the correction value is recorded in the memory 22. When a measurement result is displayed, a value of the output Vs of the voltage meter 18 is preferably corrected using the correction value of the memory 22.

Obtained data is the frequency $f_2$ of the current generator 12 and the output Vs of the voltage meter 18. By setting a horizontal axis to be the frequency $f_2$ of the current generator 12 and a vertical axis to be the output Vs (it may be a value after correction using the correction value) of the voltage meter 18 to plot these data, a spectrum of the current flowing in the conducting wire 92 of the measurement target circuit 90 is obtained (refer to FIG. 7D).

In the above process flow, after the frequency is measured from the minimum frequency to the maximum frequency of the current generator 12, a result is displayed. However, a range of frequencies to be measured may be determined and the frequency may be measured or a value for each measurement may be displayed. After the measurement ends, the process does not stop and the process may proceed to step S102 for the following measurement.

Second Embodiment

Figure 9:
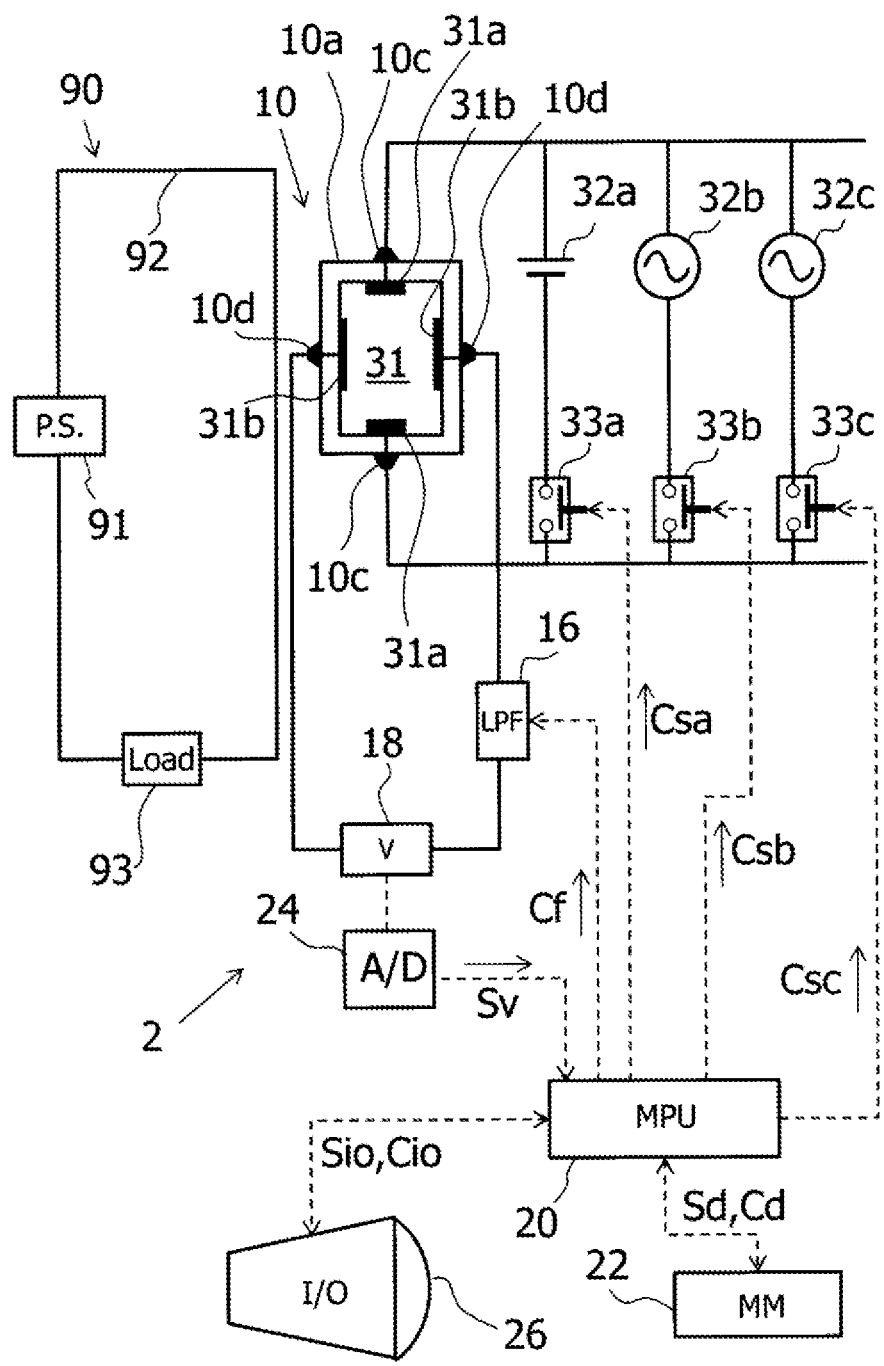
FIG. 9 is a diagram illustrating another structure of the electric current measurement apparatus.

FIG. 9 illustrates a configuration of an electric current measurement apparatus 2 according to this embodiment. The same components as those in the first embodiment are denoted with the same reference numerals and description thereof is omitted. In the electric current measurement apparatus 2, a Hall element (hereinafter, referred to as the "Hall element 31") is used as a magnetic element 31 in a sensor unit 10. In the Hall element 31, measurement voltage terminals 31b are provided at a right angle with drive current terminals 31a. Therefore, current terminals 10c and voltage terminals 10d provided in a casing 10a of the sensor unit 10 are disposed at positions of the right angle.

In addition, a plurality of current generators 32a, 32b, and 32c are connected to the current terminal 10c connected to the drive current terminal 31a of the Hall element 31. In addition, connection switches 33a, 33b, and 33c are disposed between the current generators 32a, 32b, and 32c and the current terminal 10c. Opening and closing of these connection switches 33a, 33b, and 33c are controlled by instruction signals Csa, Csb, and Csc from a controller 20. Output frequencies of the current generators 32a, 32b, and 32c are set as $f_{2,1}$, $f_{2,2}$, and $f_{2,3}$.

Here, the three current generators are shown. However, the number of current generator may be one and may be two or more.

Here, $f_{2,1}$ may be a zero frequency, as described in the first embodiment. That is, $f_{2,1}$ may be a direct current. When the frequency is zero, an alternating-current component of a measurement target circuit 90 cannot be measured. However, when a constant bias current flows in the measurement target circuit 90, a current (constant current) having a frequency of zero is supplied as $I_2$ to the sensor unit 10, so that a constant current component (bias current) in the measurement target circuit 90 can be measured.

Figure 10:
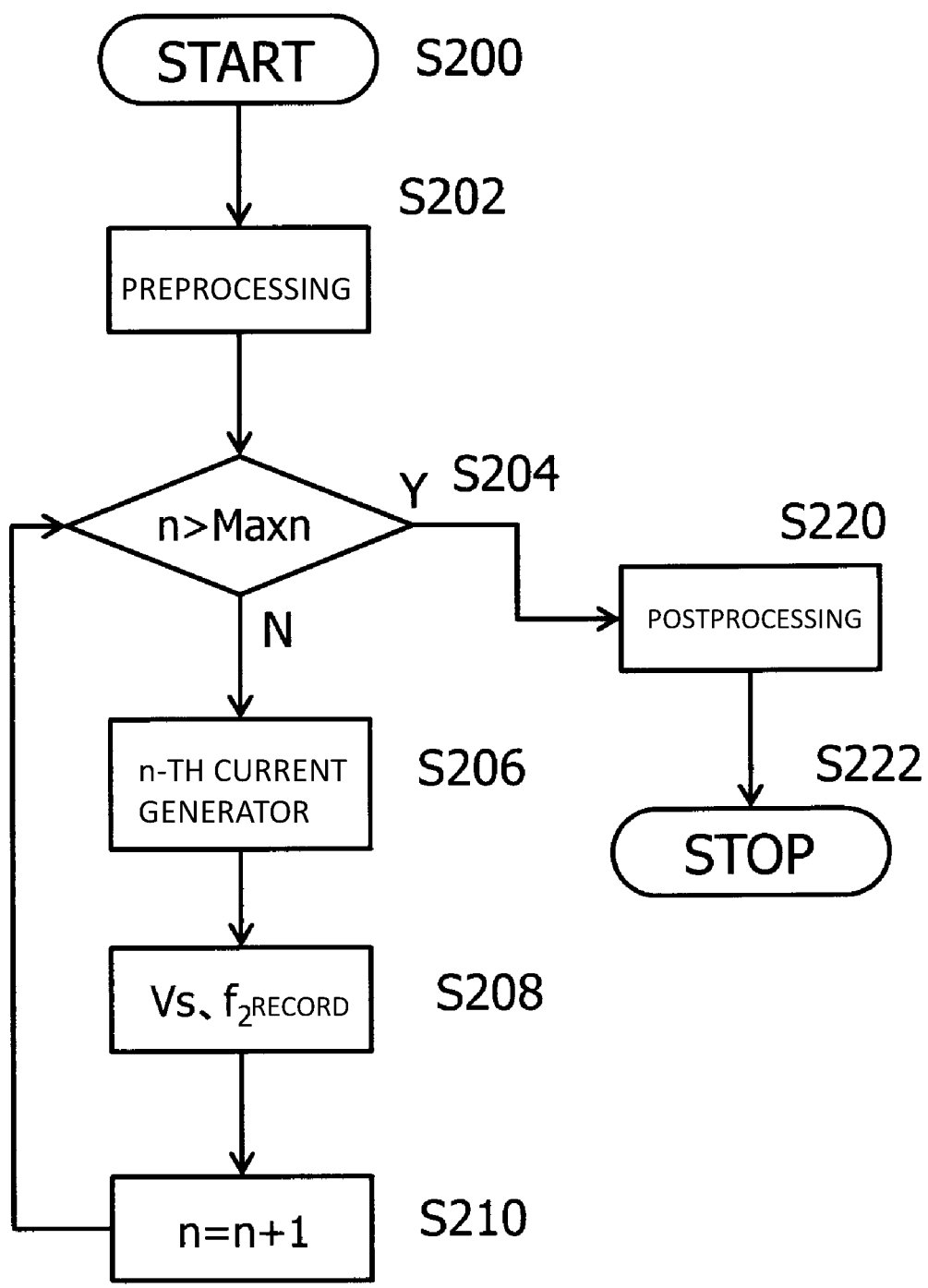
FIG. 10 is a diagram illustrating a process flow of the electric current measurement apparatus illustrated in FIG. 9.

A flow of a process by the controller 20 described below is almost the same as the flow of the process illustrated in FIG. 8. In addition, it is assumed that the number of current generators 32 is Maxn. In the case of FIG. 9, Maxn is 3. Referring to FIG. 10, when the process starts (step S200), preprocessing is executed (step S202). The preprocessing includes a process for setting n to 1. Next, it is determined whether n is larger than the number Maxn of current generator s (step S204).

If n is not more than Maxn (N of step S204), a connection switch is closed such that an n-th current generator is connected to the Hall element 31 (step S206). At this time, an output Vs of a voltage meter 18 and a frequency $f_{2,n}$ of a flowing current are recorded (step S208). Next, n is incremented (step S210) and the process returns to step S204.

If n is more than the number Maxn of current generators (Y of step S204), postprocessing (step S220) is executed and the process stops (step S222).

In the electric current measurement apparatus 2, frequencies of currents flowing in the magnetic element 31 are limited to the number of current generators 32. Therefore, this is particularly effective for the case in which a frequency of a current flowing in the measurement target circuit 90 is previously determined or the case in which a frequency to be measured is previously determined.

As described above, the electric current measurement apparatuses 1 and 2 according to the present invention can measure a spectrum of the current flowing in the measurement target circuit 90 with the very simple configuration. In addition, even when a current of a high frequency is measured, the current can be measured with precision of a bandwidth of a double of a cutoff frequency fc of a low-pass filter 16 and measurement with high Q is enabled.

In addition, the example of using the magnetoresistive element as the magnetic element 11 in the first embodiment and using the Hall element as the magnetic element 11 in the second embodiment has been described. However, these elements may be changed. That is, the Hall element may be used as the magnetic element 11 according to the first embodiment and the magnetoresistive element may be used as the magnetic element 31 according to the second embodiment.

Third Embodiment

Figure 11:
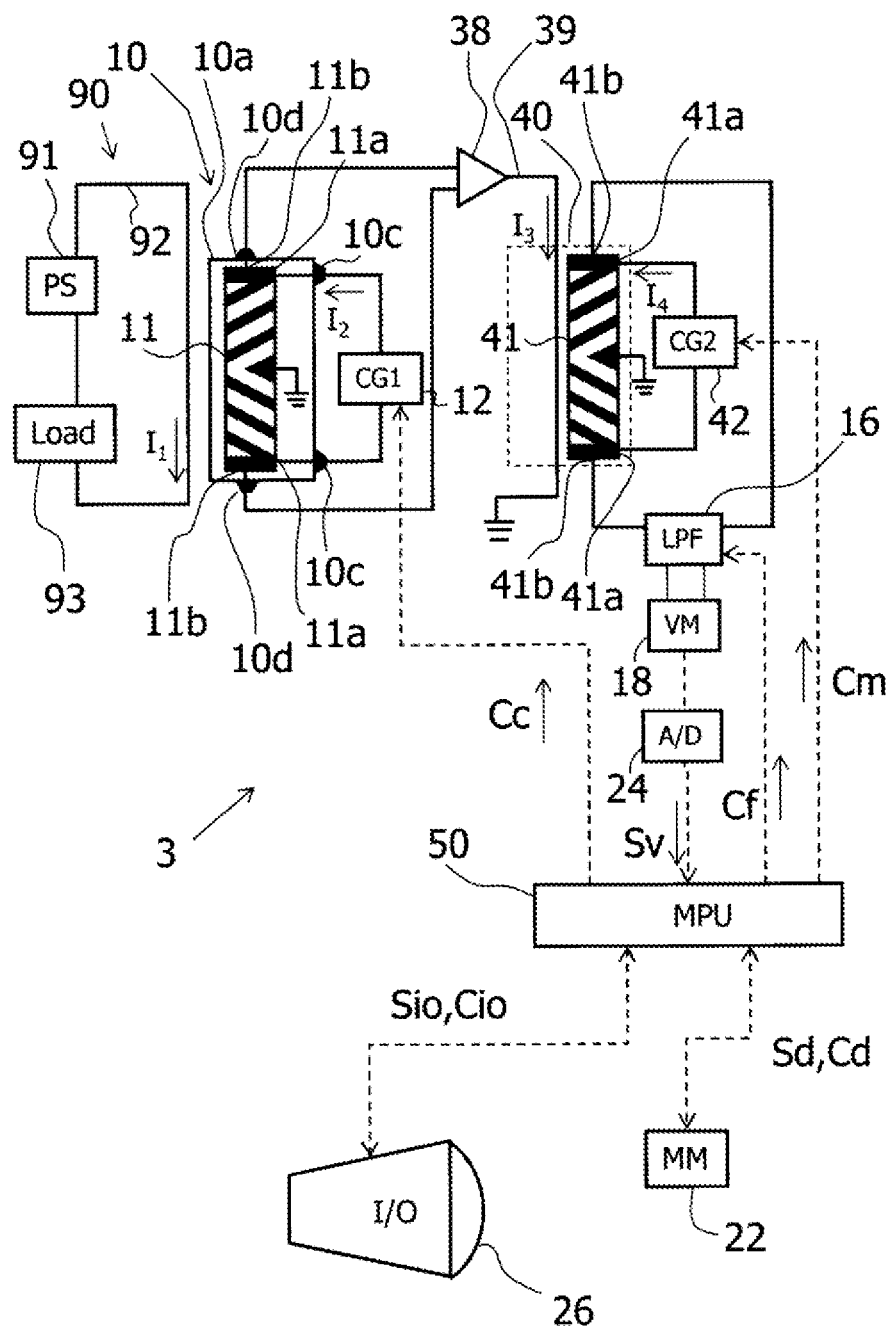
FIG. 11 is a diagram illustrating a configuration of an electric current measurement apparatus having an intermediate frequency amplifier.

FIG. 11 illustrates a configuration of an electric current measurement apparatus 3 according to this embodiment. The electric current measurement apparatus 3 has the measurement principle similar to superheterodyne. That is, a predetermined frequency band MB is previously set as an intermediate frequency. Next, a current (current $I_1$ of a measurement target circuit 90) of a frequency $f_1$ higher than the intermediate frequency is converted into a signal of a band MB by frequency conversion by a magnetic element 11 and a current generator 12. That is, a signal of a frequency of $f_1-f_2$ is down-converted to the band MB. In addition, the signal of the frequency of $f_1-f_2$ is amplified once as a signal of the intermediate frequency. Then, measurement using a different magnetic element and a different current generator (a frequency is $f_3$) is performed again with respect to the signal of the frequency of $f_1-f_2$.

This technology is mainly used to exclude an influence of a negative frequency, when a transmission signal having a constant band is down-converted from a carrier signal to a baseband signal.

A merit using this technology is particularly effective for the case in which signal strength of the frequency $f_1-f_2$ down-converted to a cutoff frequency fc or less is small. When the signal strength of the frequency $f_1-f_2$ is small, an SNR of a direct-current voltage observed through a low-pass filter 16 is lowered and measurement precision is lowered.

However, by converting the signal of the frequency $f_1-f_2$ to a frequency (intermediate frequency) higher than the cutoff frequency fc and amplifying the converted signal once, so that an SNR of a voltage Vs observed through the low-pass filter 16 can be increased. When a signal having a predetermined band is overlapped to a current to be measured, the signal of the band can be demodulated.

In FIG. 11, description is given using the configuration of FIG. 1 basically. However, this can be equally applied to the configuration of FIG. 9. That is, the magnetic element may be a magnetoresistive element or a Hall element.

In the electric current measurement apparatus 3, two sets of magnetic elements and current generators are used. A magnetic element and a current generator not provided in the electric current measurement apparatus 1 described in the first embodiment are called a second magnetic element 41 and a second current generator 42, respectively. Therefore, the magnetic element and the current generator existing in the electric current measurement apparatus 1 are called a first magnetic element 11 and a first current generator 12, respectively. In addition, individual terminals are called first drive current terminals 11a and first measurement voltage terminals 11b. In addition, a sensor unit including a casing 10a is called a first sensor unit 10.

Configurations of the measurement target circuit 90, the first magnetic element 11, and the first current generator 12 are the same as the configurations in the first embodiment. Therefore, a holder 10b is provided on the casing 10a and a conducting wire 92 of the measurement target circuit 90 is fixed by the holder 10b in a predetermined position relation with the first magnetic element 11.

In the electric current measurement apparatus 3, the first measurement voltage terminals 11b (voltage terminals 10d) are connected to a current amplifier 38. In addition, an output line 39 of the current amplifier 38 is connected to a ground. If the current amplifier 38 can flow a current proportional to an inter-terminal voltage of the first measurement voltage terminals 11b, a configuration is not limited in particular. For example, a voltage amplifier including a voltage booster may be used.

In addition, the current amplifier 38 amplifies only a signal of the band MB of the intermediate frequency and does not amplify the other signals. Therefore, the current amplifier does not need to have a flat frequency characteristic. In other words, the current amplifier may have a band-pass filter of the band MB.

The second magnetic element 41 is provided on the output line 39 of the current amplifier 38. The second magnetic element 41 may be the same as the magnetic element 11. Here, the case in which the second magnetic element will be the magnetoresistive element is described. However, the second magnetic element may be a Hall element. Similar to the first magnetic element 11, the second magnetic element 41 has a bias mechanism. Here, it is assumed that the second magnetic element is provided with a bias mechanism having conductor patterns of a barber pole type and a center tap connected to a ground, illustrated in FIG. 5A.

The second magnetic element 41 and the output line 39 are embedded in the electric current measurement apparatus 3. That is, the output line 39 and the second magnetic element 41 may not be configured separately. Therefore, like the position relation illustrated in FIG. 3A, the output line 39 may be disposed to adhere closely to a portion on or below the second magnetic element 41 in a thickness direction and may be fixed.

That is, the output line 39 and the second magnetic element 41 may be formed integrally. Specifically, the second magnetic element 41 and the output line 39 may be molded by a resin or the second magnetic element 41 and the output line 39 may be manufactured integrally by photolithography. This portion is called a second sensor unit 40. In the second sensor unit 40, a casing is not illustrated. However, the second magnetic element 41 may be stored in the casing and weather resistance may be increased. In addition, a holder to fix a position relation of the output line 39 and the second magnetic element 41 may be provided.

A pair of second drive current terminals 41a and a pair of second measurement voltage terminals 41b are provided in the second magnetic element 41. The second current generator 42 is connected to the second drive current terminal 41a. In addition, a low-pass filter 16 is connected to the second measurement voltage terminal 41b. A voltage meter 18 is connected to the low-pass filter 16. The voltage meter 18 is connected to a controller 50 via an A/D converter 24. The configuration other than the low-pass filter 16 is the same as the configuration of the electric current measurement apparatus 1 illustrated in the first embodiment. The controller 50 performs processes different from those performed by the controller 20.

The second current generator 42 generates currents of different frequencies in a longitudinal direction of the second magnetic element 41, by an instruction signal Cm of the controller 50. A current of the second current generator 42 is set as a current $I_4$ and a frequency is set as $f_3$. The second current generator 42 may generate a current of a frequency until the band MB of FIG. 12A. In other words, a current of a frequency in the band MB may be flown.

Figure 12A:
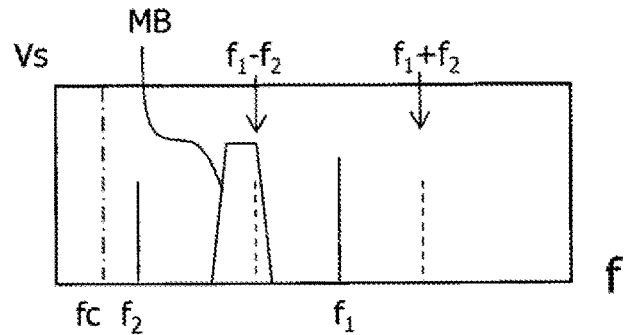
FIGS. 12A to 12D are diagrams illustrating the measurement principle of the electric current measurement apparatus of FIG. 11.

Next, an operation (process of the controller 50) of the electric current measurement apparatus 3 will be described using a configuration diagram of FIG. 11, measurement principle diagrams of FIGS. 12A to 12D, and a flow diagram of FIG. 13. To simplify the description, it is assumed that a current of a frequency $f_1$ flows in the measurement target circuit 90. Even when currents of a plurality of frequencies flow in the measurement target circuit, the currents of the plurality of frequencies can be measured by the following process.

When the process starts (step S300), preprocessing is executed (step S302). The preprocessing includes a process for setting a frequency $f_2$ of the first current generator 12 to a minimum frequency $f_{2,1}$ and setting a frequency $f_3$ of the second current generator 42 to a minimum frequency $f_{3,0}$.

Figure 12B:
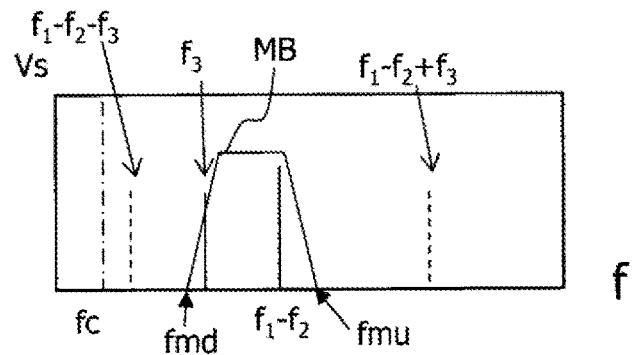
Figure 13:
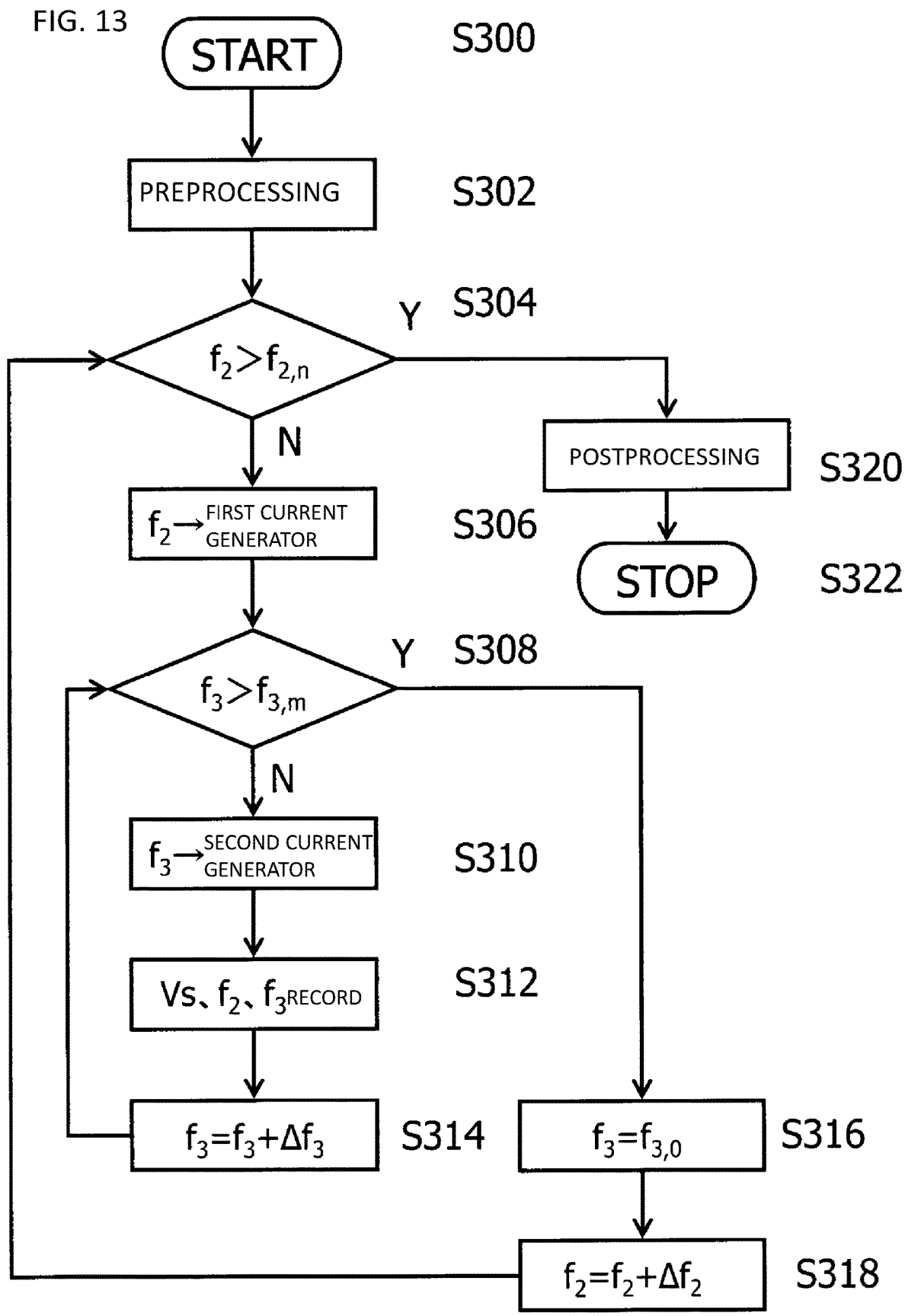
FIG. 13 is a diagram illustrating a measurement flow of the electric current measurement apparatus of FIG. 11.

Here, a frequency of a current output by the second current generator 42 may be limited to a lower frequency fmd to an upper frequency fmu of a band MB of an intermediate frequency (refer to FIG. 12B). Here, it is assumed that the minimum frequency $f_{3,0}$ output by the second current generator 42 is the lower frequency fmd of the band MB and the maximum frequency $f_{3,m}$ is the upper frequency fmu.

Next, it is determined whether the frequency $f_2$ is higher than the maximum frequency $f_{2,n}$ (step S304). If the frequency $f_2$ is higher than the maximum frequency $f_{2,n}$ (Y of step S304), postprocessing (step S320) is executed and the measurement ends (step S322).

Here, the maximum frequency $f_{2,n}$ means a maximum value of a frequency that can be supplied by the first current generator 12 and the minimum frequency $f_{2,1}$ means a minimum value of a frequency that can be supplied by the first current generator 12. If the first current generator 12 can supply an alternating current, a zero frequency (represented as a constant current "$f_{2,0}$") may be included in the minimum frequency. As a constant current flowing in the magnetic element 11, a constant current overlapped on the measurement target circuit 90 can be detected.

Next, if the frequency $f_2$ is not higher than the maximum frequency $f_{2,n}$ (N of step S304), a value of $f_2$ is transmitted to the first current generator 12 and a current $I_2$ of the frequency $f_2$ is output to the first current generator 12 (step S306). At this time, an example of a relation between frequencies of the current $I_1$ of the frequency f1 of the measurement target circuit 90 and the current $I_2$ of the frequency $f_2$ by the first current generator 12 is illustrated in FIG. 12A. The signals of the frequencies $f_1$ and $f_2$ are operated by the first magnetic element 11 to generate signals of $f_1-f_2$ and $f_1+f_2$. These signals appear between the first measurement voltage terminals 11b.

Meanwhile, the current amplifier 38 to which the first measurement voltage terminal 11b is connected does not amplify frequencies other than the band MB of the intermediate frequency. Therefore, if $f_1-f_2$ becomes a signal of the band MB of the intermediate frequency, a current proportional to an inter-terminal voltage of the first measurement voltage terminals 11b at that time flows from the current amplifier 38 to the output line 39. At this time, a proportional constant becomes an amplification factor of the current amplifier 38.

Next, the controller 50 sweeps a current of the second current generator 42. Specifically, it is determined whether the frequency $f_3$ is higher than the maximum frequency $f_{3,m}$ (step S308). If the frequency $f_3$ is higher than the maximum frequency $f_{3,m}$ (Y of step S308), a loop until step S314 is skipped. That is, the sweep is stopped. If the frequency $f_3$ is not higher than the maximum frequency $f_{3,m}$ (N of step S308), a value of $f_3$ is transmitted to the second current generator 42 and a current of the frequency $f_3$ is output to the second current generator (step S310).

FIG. 12B illustrates an example of a relation of the current (frequency $f_3$) by the second current generator 42 and the current (frequency ($f_1-f_2$)) flowing in the output line 39 at that time. In the second sensor unit 40, the signal of the frequency $f_1-f_2$ is viewed as a fixed signal. The second magnetic element 41 executes an operation between the signal of the frequency $f_1-f_2$ and the current of the frequency $f_3$ by the second current generator 42 to generate a signal of a frequency $f_1-f_2-f_3$ and a signal of a frequency $f_1-f_2+f_3$ between the second measurement voltage terminals 41b.

Next, the output Vs of the voltage meter 18 and the values of $f_2$ and $f_3$ are recorded in the memory 22 (step S312). Next, the frequency $f_3$ of the second current generator 42 is changed by a predetermined frequency $\Delta f_3$ (step S314). By repeating steps S308 to S314, a current of a certain frequency in the band MB of the intermediate frequency is down-converted to the cutoff frequency fc or less.

Figure 12C:
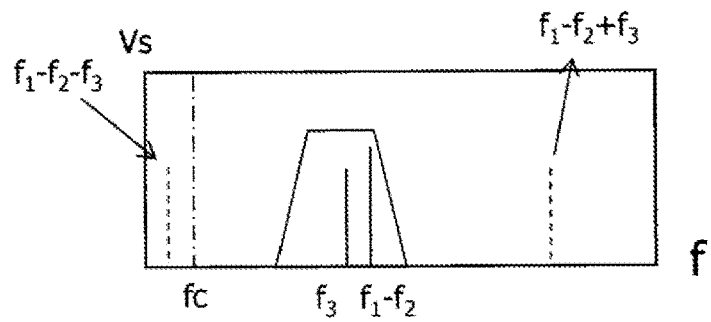

FIG. 12C illustrates a relation of individual signal frequencies when the frequency of the signal (current generated by the second current generator 42) of the frequency $f_3$ is increased by the sweep and the signal approaches the signal of the frequency $f_1-f_2$. If the signal of the frequency $f_1-f_2-f_3$ becomes lower than the cutoff frequency fc, the signal is observed as the output voltage Vs of the direct current in the voltage meter 18.

When it is determined in step S308 that the sweep of the current of the second current generator 42 ends (Y of step S308), the frequency $f_3$ is set again to an initial value $f_{3,0}$ (step S316), the frequency $f_2$ of the first current generator 12 is changed by the predetermined frequency $\Delta f_2$ (step S318), and the process returns to step S304. When it is determined in step S304 that the measurement ends, the postprocessing is executed (step S320) and the process stops (step S322).

Figure 12D:
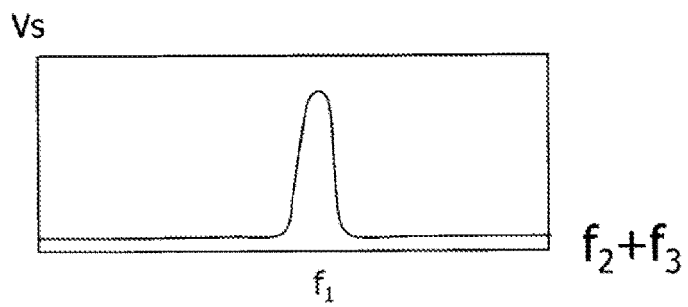

The frequencies of f2 and f3 recorded in step S312 are plotted as illustrated in FIG. 12D where the horizontal axis shows f2+f3 and the vertical axis shows the output Vs of the voltage meter 18. In this way, a spectrum of a current of the measurement target circuit 90 can be obtained. The output Vs of the vertical axis can be converted into a value of a current flowing in the measurement target circuit 90 by measuring gains of the first sensor unit 10, the current amplifier 38, and the second sensor unit 40 previously, preparing correction values, and performing compensation with the correction values. The correction values are stored in the memory 22 and the controller 50 can use the correction values at appropriate timing.

In this embodiment, $f_3$ is handled as the currents of the plurality of frequencies, but may be fixed to a predetermined frequency of the band MB of the intermediate frequency. In addition, the first current generator 12 and the second current generator 42 illustrated in FIG. 11 may change the frequencies continuously and a plurality of prepared current generators may be switched. In addition, a direct current may be included in the first current generator 12.

Fourth Embodiment

In the first, second, and third embodiments, the basic principle of the electric current measurement apparatus that can measure the frequency are described. In an actual use case, a plurality of neighboring frequencies may exist and beat between signals may occur, which can make the down conversion more complicated. In addition, in the actual use case, a current $I_1$ flowing in a conducting wire 92 and a current flowing in a magnetic element 11 are not synchronized. Therefore, phases thereof are not matched.

When the phases are not matched, an output voltage of a low-pass filter is not constant and measurement may be disabled (a measurement value is not determined). This is because a current having a frequency is not handled as a complex number. Therefore, in this embodiment, an electric current measurement apparatus 4 that can overcome a problem by handling a measurement target current as a complex number will be provided.

Figure 14:
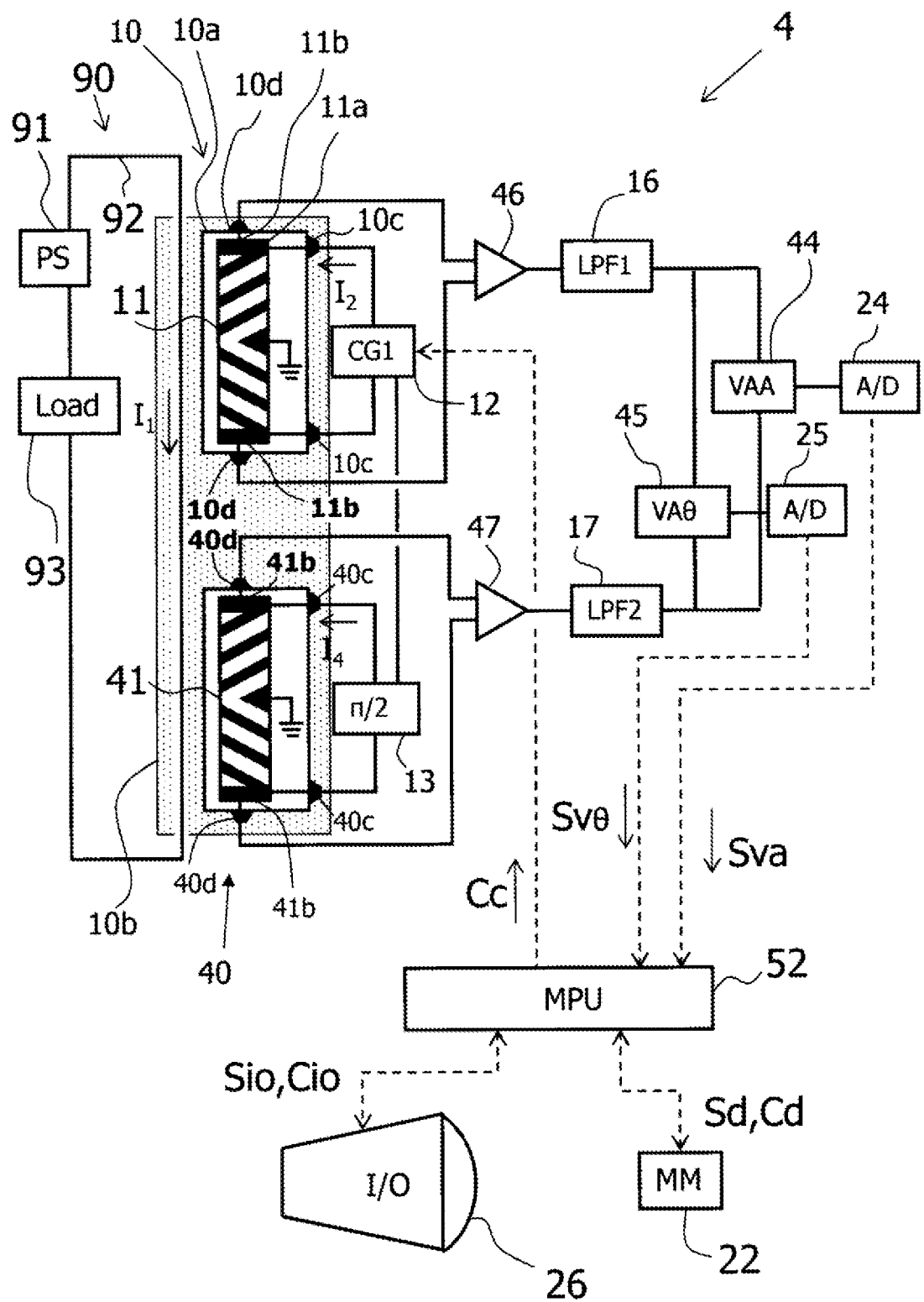
FIG. 14 is a diagram illustrating a configuration of an electric current measurement apparatus executing a complex process.

FIG. 14 illustrates a configuration of the electric current measurement apparatus 4 according to the present invention. The electric current measurement apparatus 4 includes a first sensor unit 10 having a first magnetic element 11 and a second sensor unit 40 having a second magnetic element 41, a holder 10b that fixes a position relation of a conducting wire 92 in which a current $I_1$ to be measured flows and the first sensor unit 10 and the second sensor unit 40, a current generator 12 that applies a signal of a frequency $f_1$ to the first magnetic element 11, a phase converter 13 that applies a current the phase of which is deviated by $\pi/2$ from that of a signal of the current generator 12 to the second magnetic element 41, a first low-pass filter 16 and a second low-pass filter 17 that limit a band with respect to an inter-terminal voltage of the first magnetic element 11 and the second magnetic element 41, an amplitude vector operator 44 (VAA) that calculates a square root of a sum of squares of outputs (voltage values) of the first low-pass filter 16 and the second low-pass filter 17, and a controller 52 that is coupled to the amplitude vector operator 44 and a memory 22.

In addition, a first instrumentation amplifier 46 and a second instrumentation amplifier 47 that amplify outputs of the first magnetic element 11 and the second magnetic element 41 may be included. When an output of the amplitude vector operator 44 is digitally processed, an A/D converter 24 may be provided in a rear step of the amplitude vector operator 44.

In addition, a phase vector operator 45 (VAG) that calculates an arc tangent value from the outputs of the first low-pass filter 16 and the second low-pass filter 17 may be provided. The A/D converter 25 may be connected to the output of the vector operator 45. The amplitude vector operator 44 and the phase vector operator 45 may be executed by software by the controller 52 or other processing unit.

Figure 15:
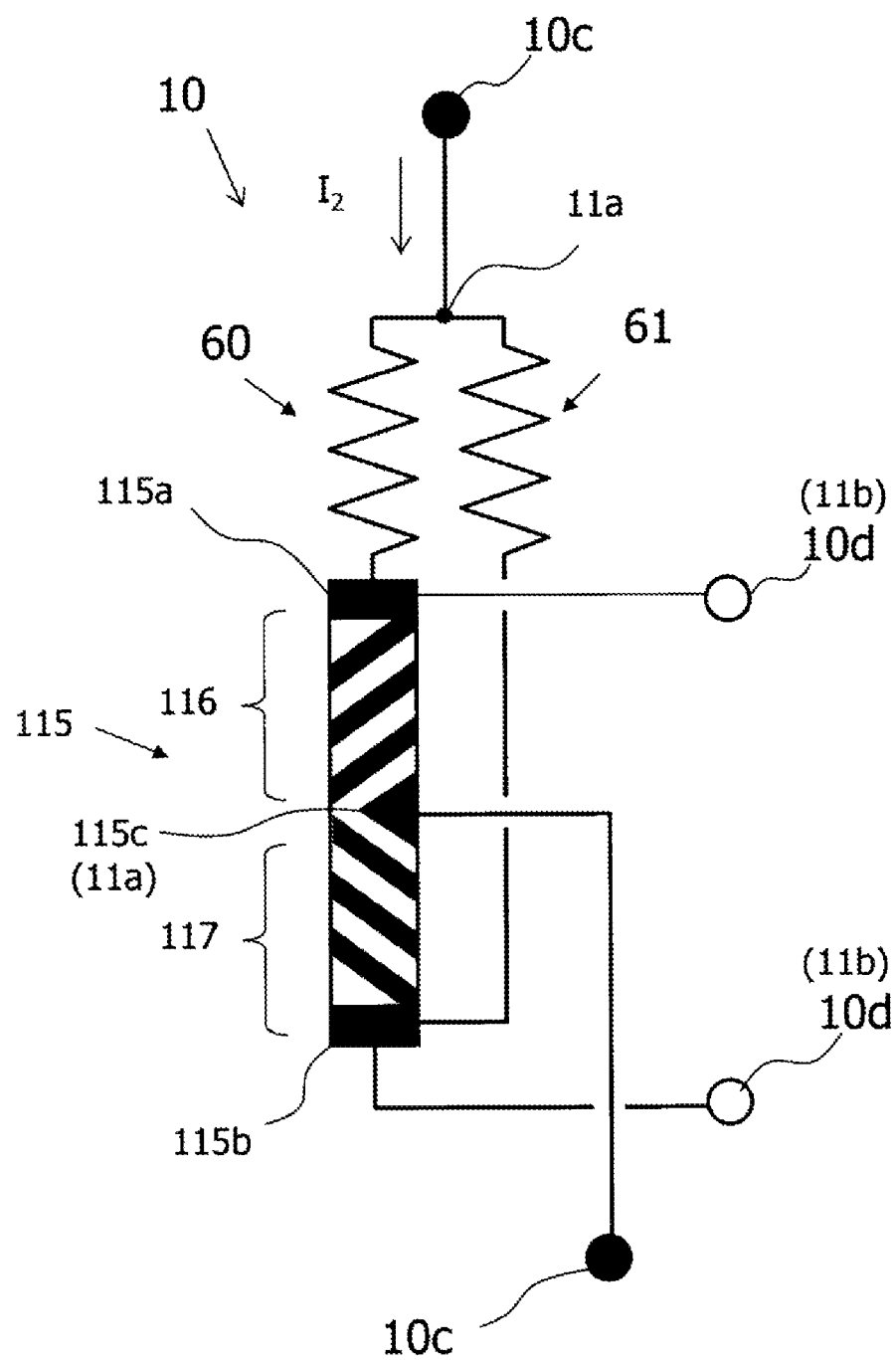
FIG. 15 is a diagram illustrating another configuration of the sensor unit.

The first magnetic element 11 and the second magnetic element 41 may have the configuration of FIGS. 4A to 4C or FIGS. 5A to 5C. However, the first magnetic element and the second magnetic element may be configured as a bridge circuit to obtain a large differential output. FIG. 15 illustrates configurations of the first sensor unit 10 (first magnetic element 11) and the second sensor unit 40 (second magnetic element 41) in a case where the bridge circuit is used. Because the first sensor unit 10 and the second sensor unit 40 have the same configuration, the configuration of only the first sensor unit 10 will be described herein.

Referring to FIG. 15, the first sensor unit 10 includes a first magnetic element 115, a bridge resistor 60, and a bridge resistor 61. One end of the bridge resistor 60 is coupled with one end of the bridge resistor 61 and these one ends become one terminal of a first drive current terminal 11a (current terminal 10c). The other end of the bridge resistor 60 is connected to one end 115a of the first magnetic element 115, and the other end of the bridge resistor 61 is connected to the other end 115b of the first magnetic element 115.

The first magnetic element 115 is considered as a magnetic element obtained by connecting an upper magnetoresistive element 116 and a lower magnetoresistive element 117 in the drawing (FIG. 15) in series. Therefore, if a center portion 115c is used as a terminal, a bridge circuit configured by connecting a serial connection portion of the bridge resistor 60 and the magnetoresistive element 116 and a serial connection portion of the bridge resistor 61 and the magnetoresistive element 117 in parallel is formed.

Here, the center portion 115c becomes the other end of the first drive current terminal 11a (current terminal 10c). In addition, one end 115a and the other end 115b of the first magnetic element 115 become a voltage terminal 10d (measurement voltage terminal 11b). The second sensor unit 40 may also have the same configuration.

Referring to FIG. 14, the current generator 12 receives an instruction signal Cc from the controller 52 and outputs a current having a frequency and strength according to an instruction. In addition, the phase converter 13 receives a current supplied from the current generator 12 and outputs a current $I_4$ a phase of which is deviated by $\pi/2$ from a phase of a current $I_2$ output by the current generator 12.

The amplitude vector operator 44 calculates a square root of a sum of squares, when the outputs of the first low-pass filter 16 and the second low-pass filter 17 are set as X and Y, respectively. More specifically, if the square root of the sum of the squares is set as W, W is represented by a formula (15).

$$W=\sqrt{X^2+Y^2} \qquad (15)$$

The phase vector operator 45 calculates an arc tangent value, when the outputs of the first low-pass filter 16 and the second low-pass filter 17 are set as X and Y, respectively. More specifically, if the arc tangent value is set as Θ, Θ is represented by a formula (16).

$$\Theta = \tan^{-1}\frac{Y}{X} \qquad (16)$$

The amplitude vector operator 44 and the phase vector operator 45 transmit each of the outputs as signals Sva and Svθ to the controller 52, respectively.

The controller 52 is connected to the current generator 12, the amplitude vector operator 44, and the phase vector operator 45. In addition, an instruction signal Cc is transmitted to the current generator 12 to control an output value output by the current generator 12, a frequency, and output timing. In addition, the signals Sva from the amplitude vector operator 44 and Svθ from the phase vector operator 45 are obtained and a relation of the frequency of the current output by the current generator 12 and the signals Sva and Svθ is output to an input/output device 26.

Next, an operation of the electric current measurement apparatus 4 will be described with reference to FIG. 14. A magnetic field is generated around the conducting wire 92 by the current $I_1$ flowing in the conducting wire 92 of the measurement target circuit 90. Meanwhile, an alternating current $I_2$ flows in the first magnetic element 11. In addition, an alternating current $I_4$ which has the same frequency as a frequency of the alternating current $I_2$ and of which a phase is deviated by $\pi/2$ from a phase of the alternating current $I_2$ flows to the second magnetic element 41.

When a current having the same frequency component as the frequency of the current flowing in the first magnetic element 11 and the second magnetic element 41 flows in the conducting wire 92, a direct-current voltage is obtained from the first low-pass filter 16 and the second low-pass filter 17, as described in the first embodiment.

An output voltage appearing between the measurement voltage terminals 11b (41b) of the first magnetic element 11 (second magnetic element 41) affected by the magnetic field generated by the current $I_1$ flowing in the conducting wire 92 while flowing the alternating current $I_2$ becomes a multiplication result of the current $I_1$ flowing in the conducting wire 92 and the current $I_2$ flowing in the first magnetic element 11. As well known, if a current which is a real signal and flowing in the conducting wire 92 is multiplied by a current a phase of which is deviated by $\pi/2$, a real number component and an imaginary number component are generated. From these components, amplitude of the real signal and a phase difference of the alternating current $I_2$ and the current $I_1$ flowing in the conducting wire 92 can be acquired.

This will be described simple below. The current $I_1$ flowing in the conducting wire 92 is set as $A \cos(2\pi f_1 t+\theta_1)$. Here, A shows amplitude. Signals output from the current generator 12 and the phase converter 13 are set as $\cos(2\pi f_2 t+\theta_2)$ and $\sin(2\pi f_2 t+\theta_2)$, respectively. When the signals are expressed by complex numbers and a result thereof is set as B, B is represented by a formula (17).

$$B = \frac{1}{2}\{A\exp[-j(2\pi f_1 t + \theta_1)] + \quad (17)$$
$$A\exp[j(2\pi f_1 t + \theta_1)]\}\exp[-j(2\pi f_2 t + \theta_2)]$$
$$= \frac{1}{2}\{A\exp[-j(2\pi f_1 t + 2\pi f_2 t + \theta_1 + \theta_2)] +$$
$$A\exp[j(2\pi f_1 t - 2\pi f_2 t + \theta_1 - \theta_2)]\}$$

Here, if the frequency $f_2$ of the current $I_2$ of the current generator 12 becomes equal to the frequency $f_1$ of the current $I_1$ flowing in the conducting wire 92, a formula (18) is obtained.

$$B = \frac{1}{2}\{A\exp[-j(4\pi f_1 t + \theta_1 + \theta_2)] + A\exp[j(\theta_1 - \theta_2)]\} \quad (18)$$

If B is extracted by a low-pass filter, $\frac{1}{2}\{A\exp[j(\theta_1-\theta_2)]\}$ can be obtained. These components are $\frac{1}{2}A\cos[(\theta_1-\theta_2)]$ and $\frac{1}{2}A\sin[(\theta_1-\theta_2)]$. These are outputs of the first low-pass filter 16 and the second low-pass filter 17. Therefore, if X is set as $\frac{1}{2}A\cos[(\theta_1-\theta_2)]$ and Y is set as $\frac{1}{2}A\sin[(\theta_1-\theta_2)]$, amplitude W and a phase $\Theta$ can be obtained as represented by the formulae (15) and (16).

Here, the obtained amplitude W does not depend on the frequency $f_1$ of the current $I_1$ flowing in the conducting wire 92, the frequencies $f_2$ of the currents $I_2$ and $I_4$ flown from the current generator 12 and the phase converter 13, and $\theta_1$ and $\theta_2$. Therefore, a stabilized value can be obtained. The controller 52 can display a relation of the frequency output to the current generator 12 and the amplitude W on the input/output device 26. A table or a correction value for converting the obtained amplitude W into a current value is stored in the memory 22. Therefore, the amplitude W may be converted into a value of a current flowing in the conducting wire 92 and may be displayed on the input/output device 26.

INDUSTRIAL APPLICABILITY

An electric current measurement apparatus according to the present invention can be used as an electric current measurement apparatus capable of being incorporated into a device as well as a stationary electric current measurement apparatus.

REFERENCE SIGNS LIST 1, 2, 3 electric current measurement apparatus
10 sensor unit
10a casing
10b holder
10c current terminal
10d voltage terminal
11 magnetic element (magnetoresistive element)
11a drive current terminal
11b measurement voltage terminal
12 current generator (first current generator)
13 phase current source (π/2 phase converter)
16 (first) low-pass filter
17 (second) low-pass filter
18 voltage meter
20 controller
22 memory
24 A/D converter
25 A/D converter
26 input/output device
31 magnetic element (Hall element)
31a drive current terminal
31b measurement voltage terminal
32a, 32b, 32c current generator
33a, 33b, 33c connection switch
38 current amplifier
39 output line
40 second sensor unit
41 second magnetic element
41a second drive current terminal
41b second measurement voltage terminal
42 second current generator
43 phase converter
44 vector operator (amplitude)
45 vector operator (phase)
46 first instrumentation amplifier
47 second instrumentation amplifier
50 controller
52 controller
60 bridge resistor
61 bridge resistor
90 measurement target circuit
91 power supply
92 conducting wire
93 load

The invention claimed is:

1. An electric current measurement apparatus to measure a current flowing in a wire, the apparatus comprising:
a first magnetic element, a resistance variation of the first magnetic element being proportional to the current;
a second magnetic element, a resistance variation of the second magnetic element being proportional to the current;
a first current source capable of supplying a first alternating current to the first magnetic element, the first current source being connected to the first magnetic element;
a second current source capable of supplying a second alternating current to the second magnetic element, a phase of the second alternating current being deviated from a phase of the first alternating current, the second current source being connected to the second magnetic element;
a first low pass filter configured to pass a low frequency component of an output from the first magnetic element;
a second low pass filter configured to pass a low frequency component of an output from the second magnetic element;
a calculator configured to calculate
a square root of a sum of squares of an output from the first low pass filter and an output from the second low pass filter, and
an arc tangent value of the output from the first low pass filter and the output from the second low pass filter.

2. The electric current measurement apparatus of claim 1, further comprising a holder configured to fix a positional relationship between the first and second magnetic elements and the wire.

3. The electric current measurement apparatus of claim 1, wherein the first current source supplies the first alternating current by changing a frequency thereof to the first magnetic element.

4. The electric current measurement apparatus of claim 3, further comprising a controller configured to control displaying a relation between the frequency of the first alternating current and the square root of the sum of squares of the output from the first low pass filter and the output from the second low pass filter.

5. The electric current measurement apparatus of claim 4, wherein the controller controls displaying the square root of the sum of squares of the output from the first low pass filter and the output from the second low pass filter by converting it to a value of the current flowing in the wire.

6. An electric current measurement apparatus to measure a current flowing in a wire, the apparatus comprising:
   a first magnetic element comprising two terminals, a resistance variation of the first magnetic element being proportional to the current;
   a first current source capable of supplying a first alternating current to the first magnetic element, the first current source being connected to the first magnetic element;
   an amplifier comprising input terminals and an output terminal, each of the input terminals being connected to each of the two terminals of the first magnetic element, the output terminal being connected to an output line;
   a second magnetic element connected to the output line;
   a second current source capable of supplying a second alternating current to the second magnetic element, the second current source being connected to the second magnetic element;
   a low pass filter configured to pass a low frequency component of an output from the second magnetic element; and
   a voltage meter configured to measure an output from the low pass filter.

7. The electric current measurement apparatus of claim 6, further comprising a holder configured to fix a positional relationship between the first magnetic element and the wire.

8. The electric current measurement apparatus of claim 6, wherein
   the first current source supplies the first alternating current by changing a frequency thereof to the first magnetic element, and
   the second current source supplies the second alternating current by changing a frequency thereof to the second magnetic element.

9. The electric current measurement apparatus of claim 8, further comprising a controller configured to control displaying a relation between a first value and a second value, the first value being a sum of the frequency of the first alternating current and the frequency of the second alternating current, the second value being the voltage outputted from the low pass filter.

10. The electric current measurement apparatus of claim 9, wherein the controller controls displaying the voltage outputted from the low pass filter by converting it to a value of the current flowing in the wire.

11. An electric current measurement apparatus to measure a first current flowing in a wire, the apparatus comprising:
    a magnetic element, a resistance variation of the magnetic element being proportional to the first current, wherein the wire in which the first current flows is separate from the magnetic element;
    a current source that generates an alternating second current to the magnetic element, the current source being directly connected to the magnetic element, wherein the alternating second current is different from the first current in the wire;
    a low pass filter is disposed between the magnetic element and a voltage meter and is connected to the magnetic element and the voltage meter, the low pass filter being configured to pass a low frequency component of an output from the magnetic element to output a voltage proportional to the first current flowing in the wire, and the voltage meter being connected to a pair of measurement voltage terminals of the magnetic element;
    a casing configured to fix the magnetic element; and
    a holder provided in the casing and configured to fix a positional relationship between the magnetic element and the wire such that a longitudinal direction of the magnetic element is matched with a direction in which the first current of the wire flows.

12. The electric current measurement apparatus of claim 11, wherein the current source supplies the alternating second current by changing a frequency thereof to the magnetic element.

13. The electric current measurement apparatus of claim 12, further comprising a controller configured to control displaying a relation between the frequency of the alternating second current and the voltage outputted from the low pass filter.

14. The electric current measurement apparatus of claim 13, wherein the controller controls displaying the voltage outputted from the low pass filter by converting it to a value of the first current flowing in the wire.

15. The electric current measurement apparatus of claim 11, wherein the current source supplies the alternating second current whose frequency is equal to a frequency of the first current flowing in the wire to the magnetic element.

* * * * *